(12) United States Patent
Wang et al.

(10) Patent No.: US 12,165,898 B2
(45) Date of Patent: Dec. 10, 2024

(54) ADJUSTABLE WAFER CHUCK

(71) Applicant: Taiwan Semiconductor Manufacturing Company, Ltd., Hsinchu (TW)

(72) Inventors: Chia-Hsi Wang, Xihu Township (TW); Yen-Yu Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 191 days.

(21) Appl. No.: 17/887,729

(22) Filed: Aug. 15, 2022

(65) Prior Publication Data
US 2024/0055290 A1 Feb. 15, 2024

(51) Int. Cl.
*H01L 21/683* (2006.01)
*H01L 21/66* (2006.01)
*H01L 21/67* (2006.01)

(52) U.S. Cl.
CPC .... *H01L 21/6833* (2013.01); *H01L 21/67253* (2013.01); *H01L 22/26* (2013.01)

(58) Field of Classification Search
CPC .......... H01L 21/6833; H01L 21/67259; H01L 21/67253; H01L 22/26
USPC ....................................................... 361/234
See application file for complete search history.

(56) References Cited

U.S. PATENT DOCUMENTS

2013/0001898 A1* 1/2013 Kim ..................... H01L 21/681
29/559

FOREIGN PATENT DOCUMENTS

CN 111378925 A * 7/2020 ........... C23C 14/042
CN 214625011 U * 11/2021

OTHER PUBLICATIONS

Machine translation of Kaneuchi Chinese Patent Document CN 111378925 A Jul. 2020 (Year: 2020).*
Machine translation of Liu et al. Chinese Patent Document CN 214625011 U Nov. 2021 (Year: 2021).*

* cited by examiner

Primary Examiner — Kevin J Comber
(74) Attorney, Agent, or Firm — Eschweiler & Potashnik, LLC

(57) ABSTRACT

Various embodiments of the present application are directed toward an adjustable wafer chuck. The adjustable wafer chuck is configured to hold a wafer. The adjustable wafer chuck comprises a base portion and a pad portion. The base portion comprises a plurality of adjustable base structures. The pad portion is disposed on a first side of the base portion. The pad portion comprises a plurality of contact pads disposed on the plurality of adjustable base structures. Each of the adjustable base structures are configured to move along a plane in a first direction and configured to move along the plane in a second direction that is opposite the first direction.

20 Claims, 15 Drawing Sheets

ADJUSTABLE WAFER CHUCK

BACKGROUND

Semiconductor device fabrication is a process for forming integrated chips (ICs). The fabrication process is a multiple-step sequence that comprises performing various deposition, photolithographic, and chemical processing steps to gradually form integrated circuits on a semiconductor wafer. Many integrated circuits are formed on the semiconductor wafer at the same time, and then the semiconductor wafer undergoes a dicing process to form the ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
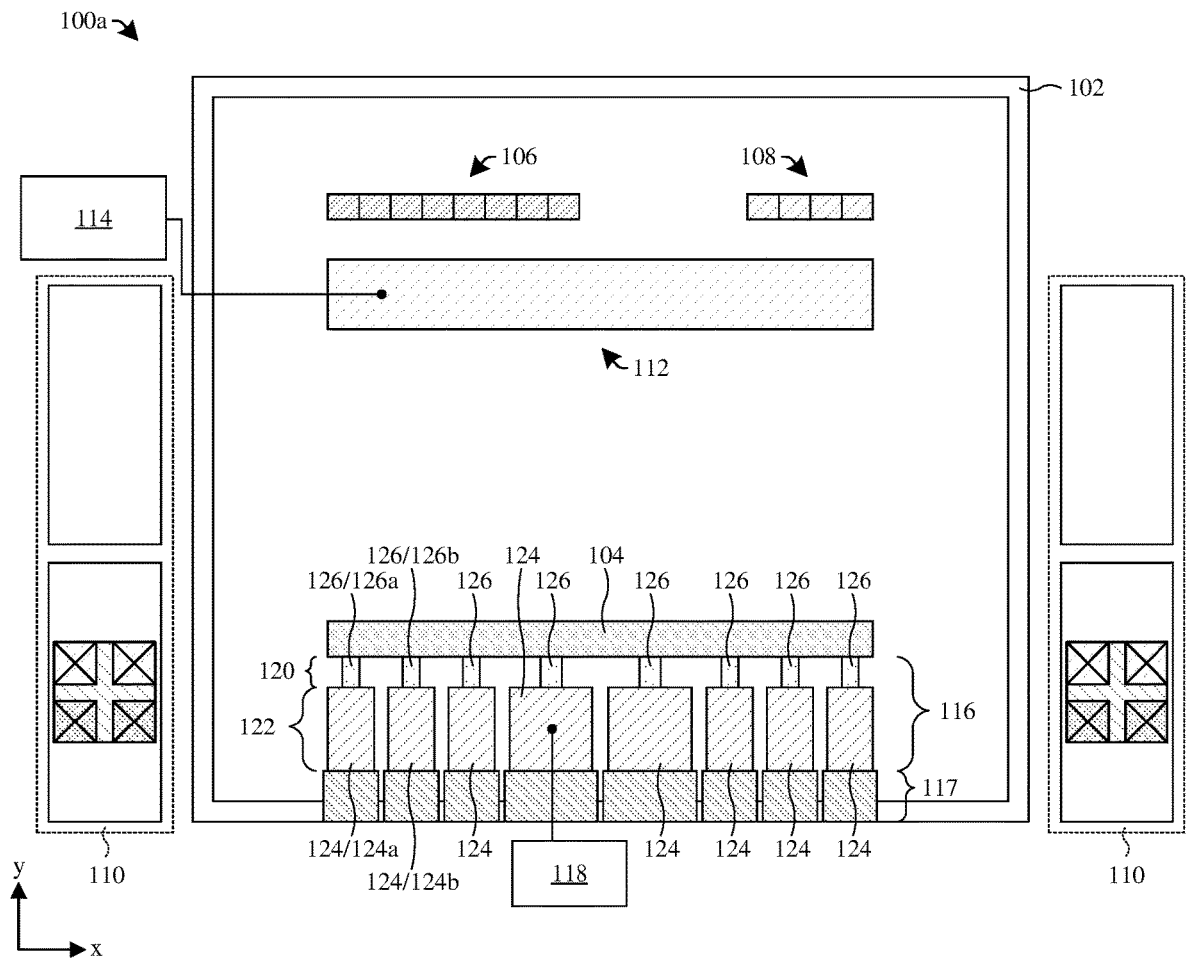
FIGS. 1A-1B illustrate various cross-sectional views of some embodiments of a process tool comprising an adjustable wafer chuck.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip (IC) comprises multiple layers (e.g., dielectric layers, conductive layers, etc.) disposed over a substrate. The multiple layers are formed by a semiconductor device fabrication process. The fabrication process comprises performing various deposition, photolithography, and removal processes to form integrated circuits on a semiconductor wafer. Typically, many integrated circuits are formed on the semiconductor wafer at the same time, and then the semiconductor wafer undergoes a dicing process to dice the semiconductor wafer into chips, thereby forming a plurality of ICs.

During the fabrication process, wafer chucks are generally relied upon to securely hold the semiconductor wafer during fabrication. For example, some deposition processes (e.g., physical vapor deposition (PVD), chemical vapor deposition (CVD), etc.) rely upon a wafer chuck having a plurality of contact pads to securely hold the semiconductor wafer in place while a layer is formed on/over the semiconductor wafer. The plurality of contact pads may improve the chucking performance (e.g., a more uniform grip force across the wafer, improved cooling across the wafer, etc.). However, the plurality of contacts pads are prone to premature wear, which may decrease chucking performance (e.g., non-uniform grip force across the wafer, increased back side pressure faults, etc.).

One potential cause of the premature wear of the plurality of contacts pads is due to warpage of the semiconductor wafer (e.g., loading a warped semiconductor wafer on the wafer chuck, a deposition process causing a semiconductor wafer to warp while the wafer is being clamped by the wafer chuck, etc.). More specifically, a warped semiconductor wafer may cause premature wear of the plurality of contacts pads due to the warped semiconductor wafer, when clamped in the wafer chuck, causing non-uniform distances between the warped semiconductor wafer and the contact pads (e.g., the warped/bowed shape (e.g., concave, convex, etc.) of the semiconductor wafer causes some contact pads to be closer to the wafer than other contact pads). This variable distance between the plurality of contact pads and the semiconductor wafer may result in increased forces on some of the plurality of contact pads, which may lead to premature wear of the some of the plurality of contact pads. Premature wear of the contact pads increases a cost to fabricate ICs due to, for example, decreased productivity (e.g., due to tool down time), increased maintenance costs (e.g., cost to repair the contact pads, cost to replace the wafer chuck, etc.), and so forth.

Various embodiments of the present application are directed toward an adjustable wafer chuck. The adjustable wafer chuck is configured to hold (e.g., clamp) a wafer. The adjustable wafer chuck comprises a base portion and a pad portion. The base portion comprises a plurality of adjustable base structures. The pad portion is disposed on a first side of the base portion. The pad portion comprises a plurality of contact pads (e.g., minimum contact area (MCA) pads) affixed to the plurality of adjustable base structures. Each of the adjustable base structures are configured to move along a plane in a first direction and configured to move along the plane in a second direction that is opposite the first direction.

Because the adjustable base structures are configured to move in the first and second directions along the plane, and because the plurality of contact pads are affixed to the plurality of adjustable base structures, distances between the plurality of contact pads and the wafer may be adjusted (e.g., tuned in relation to a feedback signal). As such, when the adjustable wafer chuck is holding a warped wafer, the distances between the plurality of contact pads and the wafer may be more uniform across the warped wafer than in comparison to a typical wafer chuck (e.g., a non-adjustable wafer chuck). Thus, the plurality of contact pads of the adjustable wafer chuck may be less prone to premature wear. Accordingly, the adjustable wafer chuck may decrease a cost to fabricate ICs (e.g., improve productivity, decrease maintenance costs, etc.).

Figure 1B:
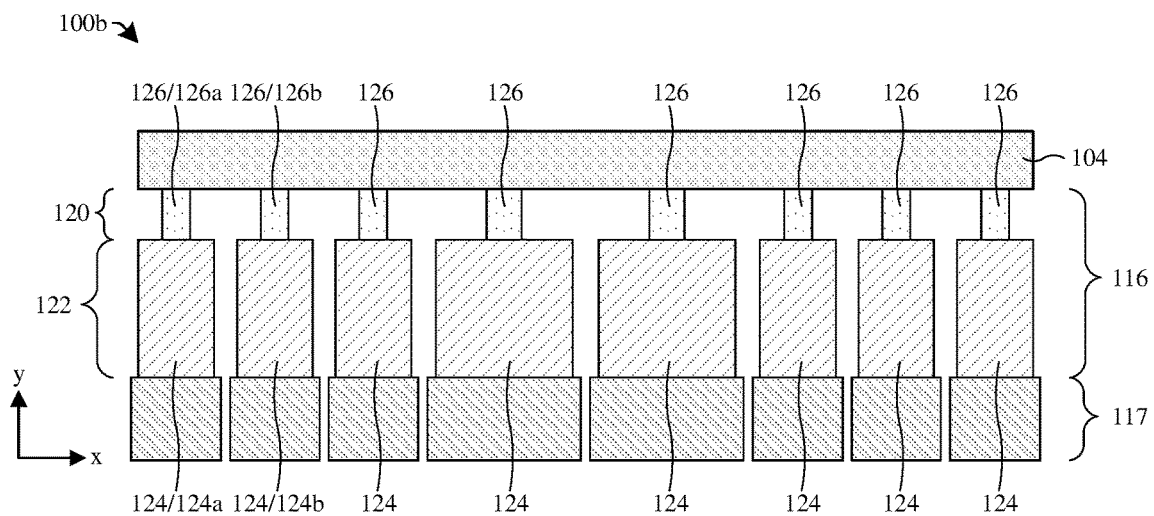

FIGS. 1A-1B illustrate various cross-sectional views 100a-100b of some embodiments of a process tool comprising an adjustable wafer chuck 116. More specifically, FIG. 1A illustrates a cross-sectional view 100a of the process tool comprising the adjustable wafer chuck 116, and FIG. 1B illustrates an enlarged cross-sectional view 100b of some embodiments of the adjustable wafer chuck 116 illustrated in FIG. 1A.

As shown in the various cross-sectional views 100a-100b of FIGS. 1A-1B, the process tool (e.g., fabrication tool) comprises a chamber housing 102 defining a processing chamber. In some embodiments, the chamber housing 102 may be or comprise, for example, steel (e.g., stainless steel), aluminum, or the like. In some embodiments, the process tool is configured for use in a deposition process (e.g., physical vapor deposition (PVD), chemical vapor deposition (CVD), etc.), an etching process, a wafer testing process (e.g., wafer probing), or the like.

For example, in some embodiments, the process tool may be configured as a deposition process tool (e.g., DC sputtering process tool, RF sputtering process tool, etc.) that is configured to deposit a layer on/over a wafer 104 (e.g., a semiconductor wafer). In such embodiments, the process tool may comprise a first magnet 106, a second magnet 108 (e.g., LDR magnet), a third magnet 110 (e.g., electromagnet), and a sputtering target 112 (e.g., a sputtering target). Further, the process tool may comprise a first power source 114 (e.g., DC power source, AC power source, RF power source, etc.). In some embodiments, the first power source 114 is electrically coupled to the sputtering target 112. In further embodiments, the sputtering target 112 may be or comprise, for example, titanium (Ti), copper (Cu), tantalum (Ta), some other material suitable for sputtering, or a combination of the foregoing.

In some embodiments, the process tool may be utilized to deposit the layer on the wafer 104 by flowing a processing gas (e.g., argon (Ar)) into the chamber housing 102. The first power source 114 provides power (e.g., a DC voltage signal) to the sputtering target 112. An electrical charge (e.g., positive charge) is applied to the wafer 104. During processing, the environment inside the chamber housing 102 is such that a plasma is generated inside the chamber housing 102 that results in atoms of the sputtering target 112 being ejected off into the plasma (e.g., via bombardment of the sputtering target 112) and being deposited on the wafer 104. In some embodiments, the first magnet 106, the second magnet 108, and/or the third magnet 110 are utilized during the deposition process to improve the deposition characteristics of the layer.

Also shown in the various cross-sectional views 100a-100b of FIGS. 1A-1B, an adjustable wafer chuck 116 is disposed in the chamber housing 102. The adjustable wafer chuck 116 is configured to hold (e.g., clamp) the wafer 104 while a fabrication process is performed in the processing chamber. For example, the adjustable wafer chuck 116 is configured to hold the wafer 104 inside the processing chamber during the deposition process (e.g., the process of depositing the layer on the wafer 104). In some embodiments, the adjustable wafer chuck 116 may be disposed on a chuck pedestal 117 that is configured to support the adjustable wafer chuck 116. In some embodiments, the chuck pedestal 117 comprises an insulating material that electrically insulates the adjustable wafer chuck 116 from the chamber housing 102.

In some embodiments, the adjustable wafer chuck 116 is an adjustable electrostatic chuck (ESC) (which may also be referred to as an adjustable electrostatic wafer chuck). In such embodiments, the adjustable wafer chuck 116 is configured to hold the wafer 104 via an electrostatic force. In further such embodiments, the adjustable wafer chuck 116 is electrically coupled to ESC circuitry 118. The ESC circuitry 118 is configured to turn the adjustable wafer chuck "ON" (e.g., via applying voltages to chucking electrodes) to electrostatically clamp the wafer 104 to the adjustable wafer chuck 116. In some embodiments, the adjustable wafer chuck 116 is configured to withstand operation in a high temperature process tool (e.g., the adjustable wafer chuck 116 may be a high temperature electrostatic chuck that can operate in temperatures between about 200° C. and about 450° C.). In some embodiments, the adjustable wafer chuck 116 is configured to withstand operation in a low temperature process tool (e.g., the adjustable wafer chuck 116 may be a super low temperature electrostatic chuck that can operate in temperatures as low as at least negative 40° C.).

The adjustable wafer chuck 116 comprises a pad portion 120 and a base portion 122. The base portion 122 comprises a plurality of adjustable base structures 124. The pad portion 120 is disposed on a side (e.g., an upper side) of the base portion 122. The pad portion 120 comprises a plurality of contact pads 126 (e.g., a plurality of minimum contact area (MCA) pads). In some embodiments, the plurality of adjustable base structures 124 are or comprise, for example, a metal (e.g., aluminum, steel, etc.), a polymer, a plastic, a ceramic, or the like. In some embodiments, the plurality of contact pads 126 are or comprise, for example, a ceramic (e.g., titanium nitride (TiN)), a polymer, a plastic, some other suitable material of a combination of the foregoing. In some embodiments, the plurality of contact pads 126 are or comprise a different material than the plurality of adjustable base structures 124.

The plurality of contact pads 126 are affixed to the plurality of adjustable base structures 124. In some embodiments, each of the contact pads of the plurality of contact pads 126 corresponds to one of the adjustable base structures. For example, a first contact pad 126a of the plurality of contact pads 126 corresponds to a first adjustable base structure 124a of the plurality of adjustable base structures 124, a second contact pad 126b of the plurality of contact pads 126 corresponds to a second adjustable base structure 124b of the plurality of adjustable base structures 124, and so forth. Each contact pad is affixed to its corresponding one of the plurality of adjustable base structures 124. For example, the first contact pad 126a is affixed to the first adjustable base structure 124a, the second contact pad 126b is affixed to the second adjustable base structure 124b, and so forth.

The plurality of contact pads 126 may be affixed to the plurality of adjustable base structures 124 by various means. For example, the plurality of contact pads 126 may be affixed to the plurality of adjustable base structures 124 via an adhesive. In other embodiments, the plurality of contact pads 126 may be affixed to the plurality of adjustable base structures 124 via one or more bonds (e.g., bonded to the plurality of adjustable base structures 124, for example, via chemical bonds between the material of the plurality of contact pads 126 and the material of the plurality of adjustable base structures 124). In yet other embodiments, the plurality of contact pads 126 may be directly affixed to a plurality of intermediate plates (e.g., polymer plates, ceramic plates, etc.) that are affixed to the plurality of adjustable base structures 124 (e.g., via an adhesive, a mechanical faster (e.g., bolt), or the like). It will be appreciated that other means of affixing the plurality of contact pads 126 to the plurality of adjustable base structures 124 are amenable.

The plurality of adjustable base structures 124 are configured to move along a plane (the y-plane) in a first direction (e.g., up) and a second direction (e.g., down) opposite the first direction. The plurality of adjustable base structures 124 are configured to move along the plane so that each of the plurality of contact pads 126 are spaced about a same distance from the wafer during a fabrication step (e.g., during a deposition process). In further embodiments, the plurality of adjustable base structures 124 may be configured to move along the plane so that each of the plurality of contact pads 126 contact the wafer during the fabrication step. In some embodiments, the plurality of adjustable base structures 124 are configured to move independently along the plane (y-plane). For example, the first adjustable base structure 124a may move along the plane (y-plane) in the first direction and the second direction independent of any of the other plurality of adjustable base structures 124, the second adjustable base structure 124b may move along the plane (y-plane) in the first direction and the second direction independent of any of the other plurality of adjustable base structures 124, and so forth.

Because the plurality of adjustable base structures 124 are configured to move in the first and second directions along the plane (y-plane), and because the plurality of contact pads 126 are affixed to the plurality of adjustable base structures 124, distances (chucking distances) between the plurality of contact pads 126 and the wafer 104 may be adjusted (e.g., tuned in relation to a feedback loop). As such, if the adjustable wafer chuck 116 is holding a warped wafer (e.g., a wafer having a concave or convex shape when viewed in the cross-sectional views illustrated in FIG. 1B), the distances between the plurality of contact pads 126 and the wafer 104 may be more uniform across the warped wafer than in comparison to a typical wafer chuck (e.g., a non-adjustable wafer chuck). Thus, the plurality of contact pads 126 of the adjustable wafer chuck may be less prone to premature wear. Accordingly, the adjustable wafer chuck 116 may decrease a cost to fabricate ICs (e.g., improve productivity, decrease maintenance costs, etc.).

Figure 2A:
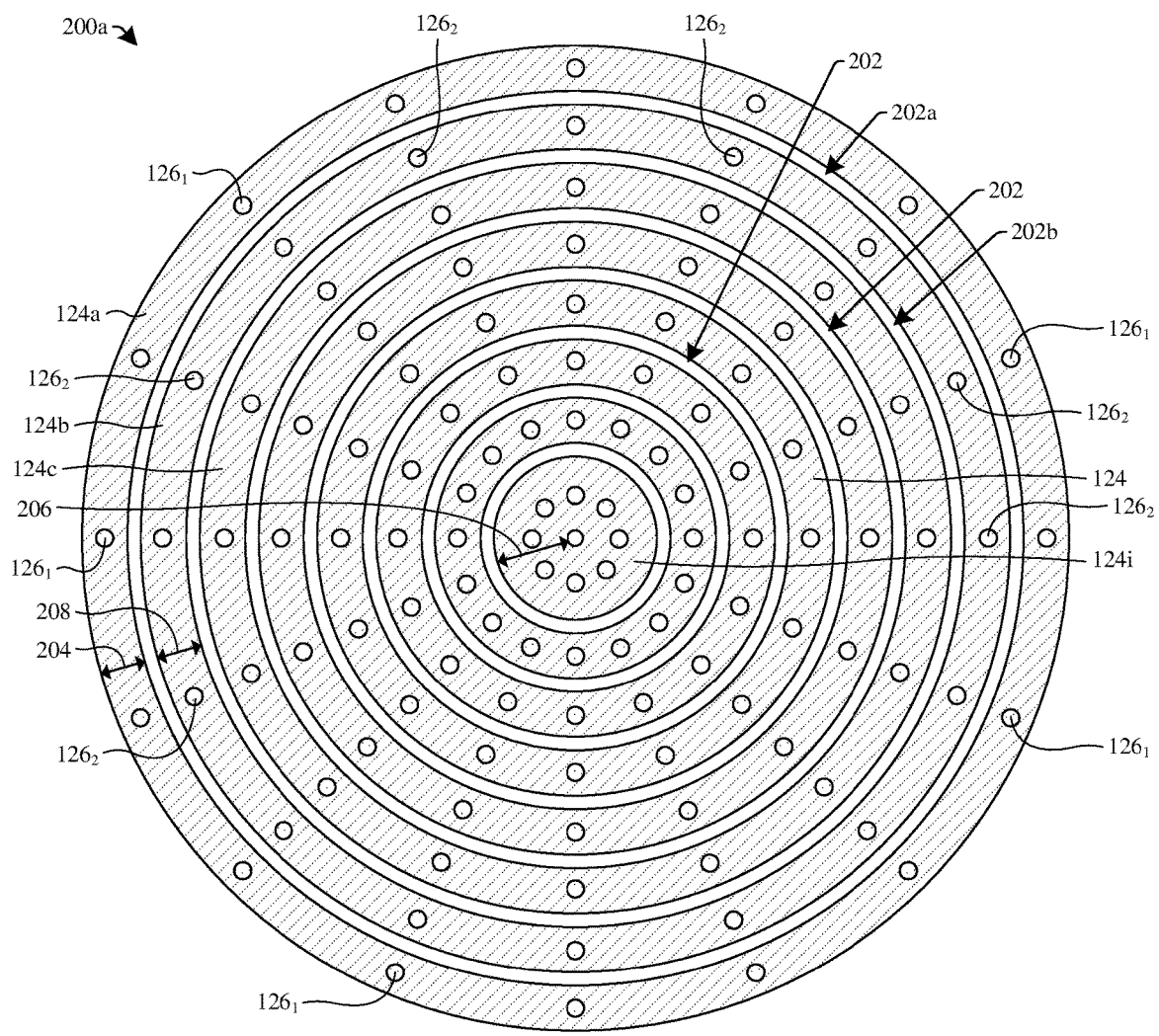
FIGS. 2A-2B illustrates various views of some other embodiments of the adjustable wafer chuck.
Figure 2B:
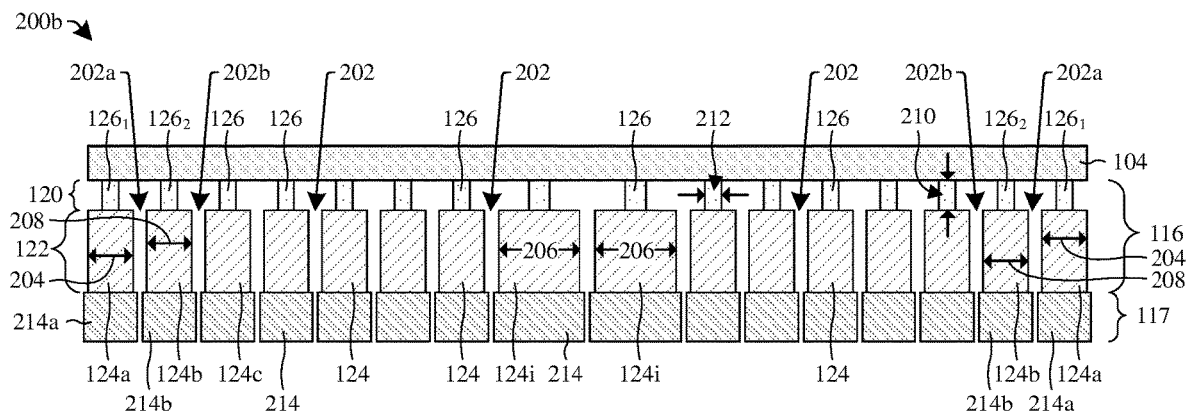

FIGS. 2A-2B illustrates various views 200a-200b of some other embodiments of the adjustable wafer chuck 116. More specifically, FIG. 2A illustrates a top view 200a of some embodiments of the adjustable wafer chuck 116, and FIG. 2B illustrates a cross-sectional view 200b of some embodiments of the adjustable wafer chuck 116 of FIG. 2A.

As shown in the various views 200a-200b of FIGS. 2A-2B, the plurality of adjustable base structures 124 may have ring-like shapes. The plurality of adjustable base structures 124 may be laterally spaced from one another. In some embodiments, the plurality of adjustable base structures 124 are laterally spaced from one another via gaps 202. For example, the first adjustable base structure 124a is laterally spaced from the second adjustable base structure 124b via a first gap 202a, the second adjustable base structure 124b is laterally spaced from a third adjustable base structure 124c via a second gap 202b, and so forth. The gaps 202 extend (completely) through the plurality of adjustable base structures 124, such that the plurality of adjustable base structures 124 are (completely) laterally spaced from one another. For example, an innermost sidewall of the first adjustable base structure 124a laterally surrounds an outermost sidewall of the second adjustable base structure 124b, and the innermost sidewall of the first adjustable base structure 124a is laterally spaced from the outermost sidewall of the second adjustable base structure 124b via the first gap 202a. In some embodiments, the plurality of adjustable base structures 124 are concentric.

In some embodiments, an innermost adjustable base structure 124i of the plurality of adjustable base structures 124 has a different thickness (e.g., ring thickness) than one or more of the other plurality of adjustable base structures 124. In further embodiments, the thickness (e.g., ring thickness) of the innermost adjustable base structure 124i may be greater than a thickness of one or more of the other plurality of adjustable base structures 124. For example, the first adjustable base structure 124a has a first thickness 204 (e.g., a first ring thickness), and the innermost adjustable base structure 124i has a second thickness 206 (e.g., a second ring thickness) that is greater than the first thickness 204. In yet further embodiments, the innermost adjustable base structure 124i may have a greater thickness (e.g., a greater ring thickness) than each of the other plurality of adjustable base structures 124. For example, the third adjustable base structure 124c has a third thickness 208 (e.g., a third ring thickness); and the second thickness 206 is greater than the first thickness 204, the third thickness 208, and so forth.

In some embodiments, the first thickness 204 is substantially the same as the third thickness 208, and the second thickness 206 is greater than both the first thickness 204 and the third thickness 208. In other embodiments, the thicknesses of the plurality of adjustable base structures 124 may be substantially the same. For example, in some embodiments, the first thickness 204, the second thickness 206, and the third thickness 208 are substantially the same. In further embodiments, the thicknesses of the plurality of adjustable base structures 124 may be between about 1 millimeter (mm) and about 150 mm. In further embodiments, the thicknesses of the plurality of adjustable base structures 124 may be between about 25 mm and about 35 mm. For example, the first thickness 204 may be between about 25 mm and about 35 mm, the second thickness 206 may be between about 25 mm and about 35 mm, the third thickness 208 may be between about 25 mm and about 35 mm, and so forth. In yet further embodiments, the thicknesses of the plurality of adjustable base structures 124 may be about 30 mm.

Also shown in the various views 200a-200b of FIGS. 2A-2B, the plurality of contact pads 126 comprises a plurality of groups of contact pads $126_1$-$126_2$. Each of the plurality of groups of contact pads $126_1$-$126_2$ comprises one or more individual contact pads of the plurality of contact pads 126. For example, the groups of contact pads $126_1$-$126_2$ comprises a first group of contact pads $126_1$ and a second group of contact pads $126_2$. The first group of contact pads $126_1$ comprises one or more first contact pads of the plurality of contact pads 126. The second group of contact pads $126_2$ comprises one or more second contact pads of the plurality of contact pads 126. The groups of contact pads $126_1$-$126_2$ are respectively affixed to the plurality of adjustable base structures 124. For example, the contact pads of the first group of contact pads $126_1$ are affixed to the first adjustable base structure 124a, the contact pads of the second group of contact pads $126_2$ are affixed to the second adjustable base structure 124b, and so forth.

Each of the plurality of contact pads 126 have a height 210 and a width 212. In some embodiments, the height 210 is between about 0.5 mm and about 5 mm. In further embodiments, the height 210 is between about 1 mm and about 3 mm. In some embodiments, the heights of the contact pads of one of the plurality of groups of contact pads $126_1$-$126_2$ are substantially the same. For example, the heights of the one or more first contact pads may be substantially the same (e.g., substantially the same includes small variations due to manufacturing processes). In further embodiments, the heights of the plurality of contact pads 126 may be substantially the same. In other embodiments, a height of one or more of the contact pads of a group of contact pads may be different that a height of one or more other contact pads of the group of contact pads. For example, the height of a first one of the first contact pads may be different than the height of a second one of the first contact pads. In yet other embodiments, a height of one of the plurality of contact pads 126 may differ from a height of one or more other of the plurality of contact pads 126. In yet further embodiments, the heights of the contact pads of one of the plurality of groups of contact pads $126_1$-$126_2$ are substantially the same and the heights of the contact pads of another one of the plurality of groups of contact pads $126_1$-$126_2$ are substantially the same, but the heights of the contact pads of the one of the plurality of groups of contact pads $126_1$-$126_2$ are different than the heights of the contact pads of the another one of the plurality of groups of contact pads $126_1$-$126_2$. For example, each of the first contact pads may have a first height and each of the second contact pads may have a second height different than the first height.

Also shown in the various views 200a-200b of FIGS. 2A-2B, the chuck pedestal 117 may comprise a plurality of pedestal structures 214. For example, the chuck pedestal 117 may comprise a first pedestal structure 214a, a second pedestal structure 214b, and so forth. In some embodiments, the plurality of adjustable base structures 124 are respectively disposed on (e.g., affixed to) the plurality of pedestal structures 214. For example, the first adjustable base structure 124a is disposed on the first pedestal structure 214a, the second adjustable base structure 124b is disposed on the second pedestal structure 214b.

The plurality of pedestal structures 214 respectively correspond to the plurality of adjustable base structures 124. For example, the first pedestal structure 214a corresponds to the first adjustable base structure 124a, the second pedestal structure 214b corresponds to the second adjustable base structure 124b, and so forth. Each of the plurality of pedestal structures 214 have a shape that corresponds to a shape of its corresponding adjustable base structure. For example, a shape of the first pedestal structure 214a corresponds to a shape of the first adjustable base structure 124a. More specifically, if the first adjustable base structure 124 has a ring-like shape, the first pedestal structure 214a has a corresponding ring-like shape. In further embodiments, the plurality of pedestal structures 214 are laterally spaced form one another (e.g., via gaps).

Figure 3:
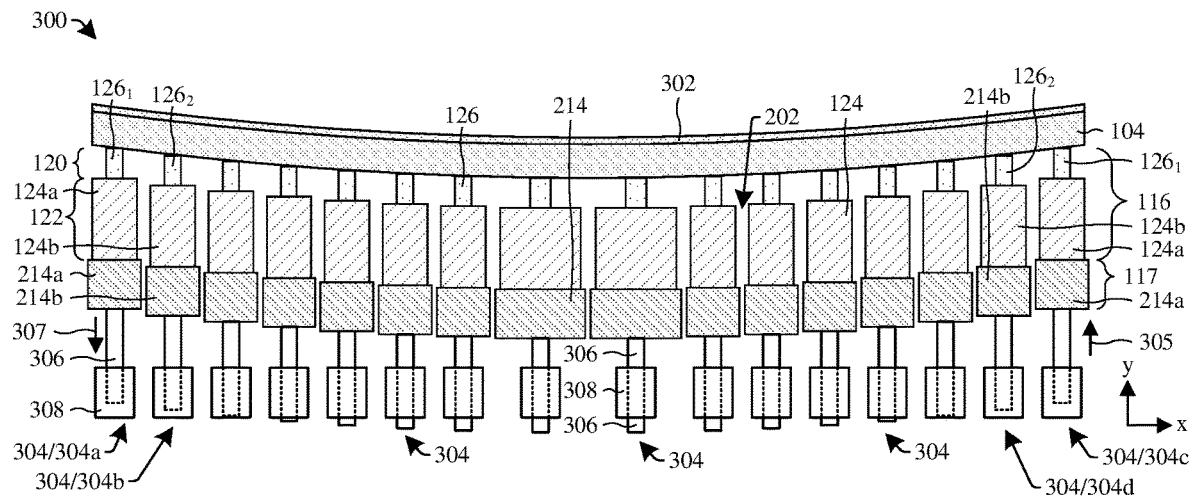
FIG. 3 illustrates a cross-sectional view of some other embodiments of the adjustable wafer chuck.

FIG. 3 illustrates a cross-sectional view 300 of some other embodiments of the adjustable wafer chuck 116.

As shown in the cross-sectional view 300 of FIG. 3, the wafer 104 is warped/bowed. The wafer 104 may be warped due to a first layer 302 being disposed/formed on the wafer 104. More specifically, the first layer 302 may be a compressive film that causes the wafer 104 to warp.

Also shown in the cross-sectional view 300 of FIG. 3, a plurality of actuators 304 are coupled to the plurality of adjustable base structures 124. In some embodiments, each of the actuators of the plurality of actuators 304 corresponds to one of the adjustable base structures 124. For example, a first actuator 304a of the plurality of actuators 304 corresponds to the first adjustable base structure 124a, a second actuator 304b of the plurality of actuators 304 corresponds to the second adjustable base structure 124b, and so forth. In further embodiments, multiple actuators correspond to a same adjustable base structure. For example, the first actuator 304a and a third actuator 304c of the plurality of actuators 304 correspond to the first adjustable base structure 124a, the second actuator 304b and a fourth actuator 304d of the plurality of actuators 304 correspond to the second adjustable base structure 124b, and so forth.

In some embodiments, the plurality of actuators 304 may be coupled to the plurality of adjustable base structures 124 via the plurality of pedestal structures 214. For example, the first actuator 304a and the third actuator 304c may be (directly) coupled (e.g., affixed) to the first pedestal structure 214a, which is coupled to the first adjustable base structure 124a; the second actuator 304b and the fourth actuator 304d may be (directly) coupled (e.g., affixed) to the second pedestal structure 214b, which is coupled to the second adjustable base structure 124b; and so forth. In other embodiments, the plurality of actuators 304 may be (directly) coupled to the plurality of adjustable base structures 124, or the plurality of actuators 304 may be coupled to the plurality of adjustable base structures 124 via some other structure(s).

The plurality of actuators 304 are configured to move their corresponding adjustable base structure along the plane (y-plane) in a first direction 305 (e.g., up) and a second direction 307 (e.g., down). For example, the first actuator 304a and the third actuator 304c are configured to move the first adjustable base structure 124a along the plane (y-plane) in both the first direction 305 and the second direction 307; the second actuator 304b and the fourth actuator 304d are configured to move the second adjustable base structure 124b along the plane (y-plane) in both the first direction 305 and the second direction 307; and so forth. The plurality of actuators 304 are configured to move their corresponding adjustable base structure along the plane (y-plane) so that each of the plurality of contact pads 126 are spaced about a same distance from the wafer 104 during a fabrication step (e.g., during a deposition process).

In some embodiments, the plurality of actuators 304 are configured to move their corresponding adjustable base structure independently along the plane (y-plane). For example, the first actuator 304a and the third actuator 304c are configured to move the first adjustable base structure 124a along the plane (y-plane) in both the first and second directions independent of any of the other plurality of adjustable base structures 124 moving along the plane (y-plane); the second actuator 304b and the fourth actuator 304d are configured to move the second adjustable base structure 124b along the plane (y-plane) in both the first and second directions independent of any of the other plurality of adjustable base structures 124 moving along the plane (y-plane); and so forth. In some embodiments, the plurality of actuators 304 may be, for example, an electric actuator, a pneumatic actuator, a hydraulic actuator, a linear actuator, some other suitable actuator, or a combination of the foregoing.

In some embodiments, each of the plurality of actuators 304 comprise an extension structure 306 (e.g., drive tube, piston, etc.) and a housing structure 308. The housing structure 308 is configured to be held in a fixed position, and the extension structure 306 is configured to move through the housing structure 308 along the plane (y-plane). The housing structure 308 comprises movement mechanisms (e.g., gears, magnets, screws, valves, etc.) that are configured to move the extension structure 306 in relation to the housing structure 308. The extension structure 306 of each of the plurality of actuators 304 is coupled to one or more of the plurality of adjustable base structures 124 (e.g., via the plurality of pedestal structures 214). As such, the plurality of actuators 304 may selectively move their corresponding adjustable base structure along the plane (y-plane) by selectively moving their extension structure 306.

Figure 4:
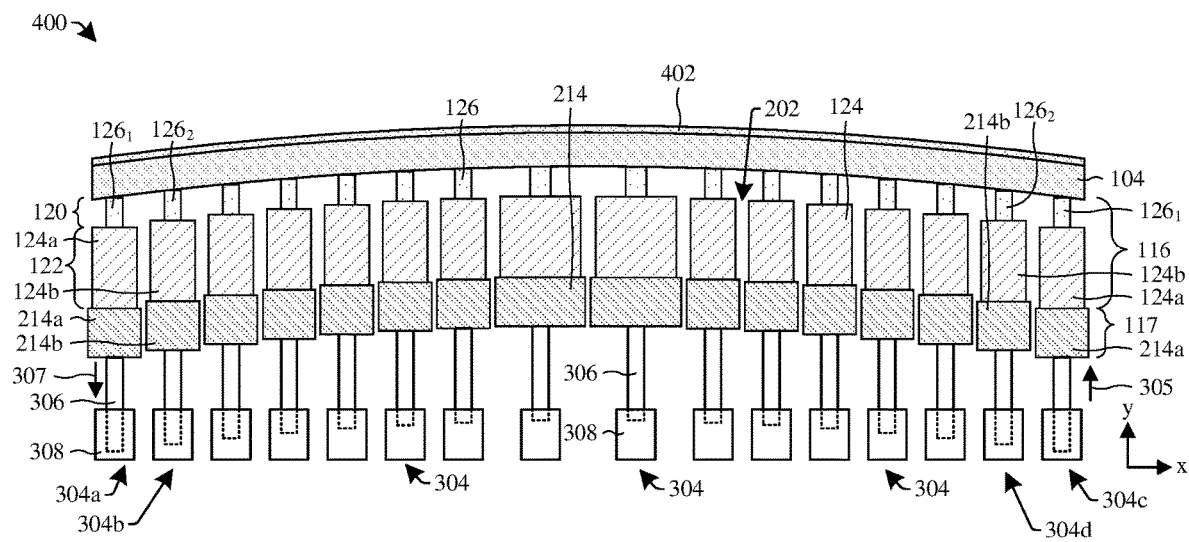
FIG. 4 illustrates a cross-sectional view of some other embodiments of the adjustable wafer chuck.

FIG. 4 illustrates a cross-sectional view 400 of some other embodiments of the adjustable wafer chuck 116.

As shown in the cross-sectional view 400 of FIG. 4, the wafer 104 is warped/bowed in an opposite manner as the wafer in FIG. 3. The wafer 104 may be warped due to a second layer 402 being disposed/formed on the wafer 104. More specifically, the second layer 402 may be a tensile film that causes the wafer 104 to warp.

Because the plurality of actuators 304 are configured to move their corresponding adjustable base structure along the plane (y-plane) in both the first direction 305 and the second direction 307, regardless of the manner in which the wafer 104 is warped (e.g., convex or concave), the plurality of actuators 304 are able to move the plurality of adjustable base structures 124 so that each of the plurality of contact pads 126 are spaced about a same distance from the wafer 104 during a fabrication step (e.g., during a deposition process). It will be appreciated that, even if the wafer 104 is not warped, the plurality of actuators 304 are able to move the plurality of adjustable base structures 124 so that each of the plurality of contact pads 126 are spaced about a same distance from the wafer 104 during a fabrication step.

Figure 5:
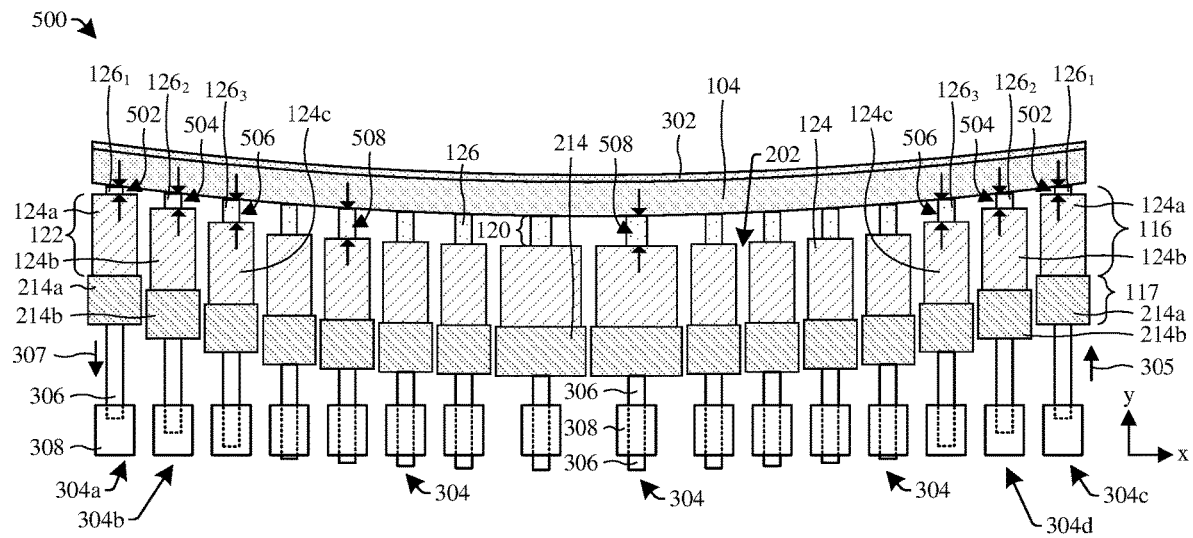
FIG. 5 illustrates a cross-sectional view of some other embodiments of the adjustable wafer chuck.

FIG. 5 illustrates a cross-sectional view 500 of some other embodiments of the adjustable wafer chuck 116.

As shown in the cross-sectional view 500 of FIG. 5, some of the contact pads of the plurality of contact pads 126 may have different heights than some other of the contact pads. For example, the plurality of groups of contact pads $126_1$-$126_3$ comprises the first group of contact pads $126_1$, the second group of contact pads $126_2$, and a third group of contact pads $126_3$. The third group of contact pads $126_3$ comprises one or more third contact pads of the plurality of contact pads 126. In some embodiments, the contact pads of the third group of contact pads $126_3$ are affixed to the third adjustable base structure 124c. The contact pads of the first group of contact pads $126_1$ have a first height 502, the contact pads of the second group of contact pads $126_2$ have a second height 504, the contact pads of the third group of contact pads $126_3$ have a third height 506, and the contact pads of the other groups of the plurality of groups of contact pads $126_1$-$126_3$ have a fourth height 508.

In some embodiments, the fourth height 508 is different than the first height 502, the second height 504, and/or the third height 506. In some embodiments, the third height 506 is different than the first height 502, the second height 504, and/or the fourth height 508. In some embodiments, the second height 504 is different than the first height 502, the third height 506, and/or the fourth height 508. In some embodiments, the first height 502 is different than the second height 504, the third height 506, and/or the fourth height 508.

In some embodiments, the third height 506 is less than the fourth height 508. In some embodiments, the second height 504 is less than the third height 506. In some embodiments, the first height 502 is less than the second height 504. In some embodiments, the first height 502 may be between about 0.5 mm and about 4.9 mm. In further embodiments, the first height 502 may be between about 0.5 mm and about 1.5 mm. In yet further embodiments, the first height 502 may be about 1 mm. In some embodiments, the fourth height 508 may be between about 0.6 mm and about 5 mm. In further embodiments, the fourth height 508 may be between about 2.5 mm and about 3.5 mm. In yet further embodiments, the first height 502 may be about 3 mm. In further embodiments, the second height 504 is between the first height 502 and the third height 506. In yet further embodiments, the third height 506 is between the second height 504 and the fourth height 508.

Because the plurality of actuators 304 are configured to independently move their corresponding adjustable base structure along the plane (y-plane), even if the plurality of contact pads 126 have varying heights, the plurality of actuators 304 are able to move the plurality of adjustable base structures 124 so that each of the plurality of contact pads 126 are spaced about a same distance from the wafer 104 during a fabrication step (e.g., during a deposition process). In some embodiments, the plurality of contact pads 126 have varying heights due to the expected wear of the plurality of contact pads 126 (e.g., the outer contacts pads wearing at a faster rate than inner contact pads). In such embodiments, the adjustable wafer chuck 116 may have a longer lifespan than a typical wafer chuck (e.g., due to the adjustable wafer chuck 116 being able to compensate for the height variations). In other embodiments, the plurality of contact pads 126 have varying heights due to a process in which the plurality of contact pads 126 are formed (e.g., the process for depositing the plurality of contact pads 126 onto the plurality of adjustable base structures 124 may be relatively non-uniform). In such embodiments, in comparison to a typical wafer chuck (e.g., non-adjustable wafer chuck), the adjustable wafer chuck 116 may have improved initial performance (e.g., due to the adjustable wafer chuck 116 being able to compensate for the height variations).

Figure 6:
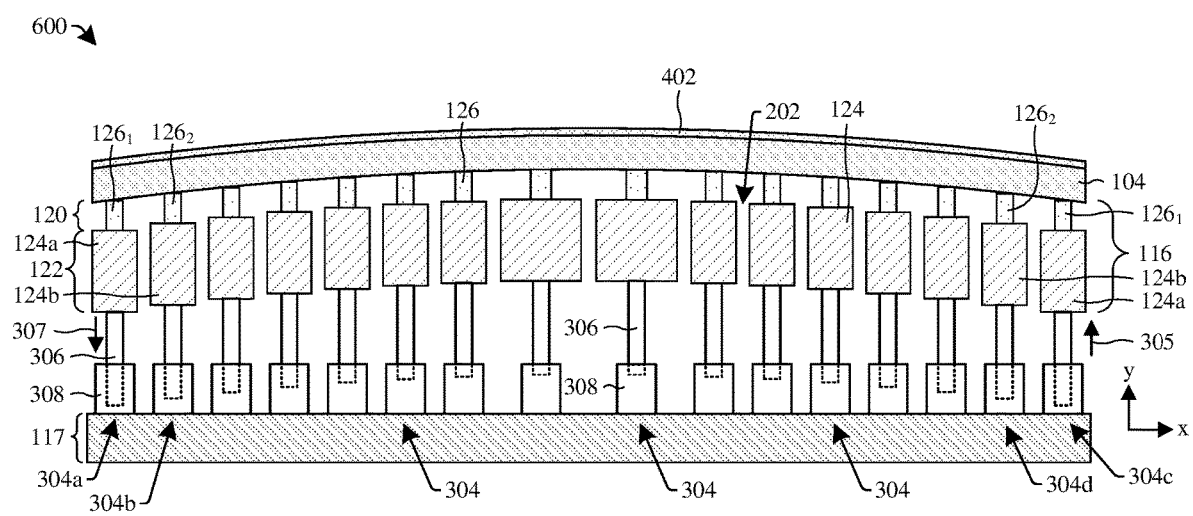
FIG. 6 illustrates a cross-sectional view of some other embodiments of the adjustable wafer chuck.

FIG. 6 illustrates a cross-sectional view 600 of some other embodiments of the adjustable wafer chuck 116.

As shown in the cross-sectional view 600 of FIG. 6, in some embodiments, the plurality of actuators 304 are disposed between the chuck pedestal 117 and the plurality of adjustable base structures 124. In such embodiments, the chuck pedestal 117 may comprise a continuous structure in which each of the plurality of actuators 304 are disposed on. In other such embodiments, the chuck pedestal 117 may comprise the plurality of pedestal structures 214. In further embodiments, the housing structure 308 of each of the plurality of actuators 304 may be (directly) disposed on (e.g., affixed to) the chuck pedestal 117. In yet further embodiments, the extension structures of the plurality of actuators 304 may be (directly) coupled to (e.g., affixed to) the plurality of adjustable base structures 124.

Figure 7A:
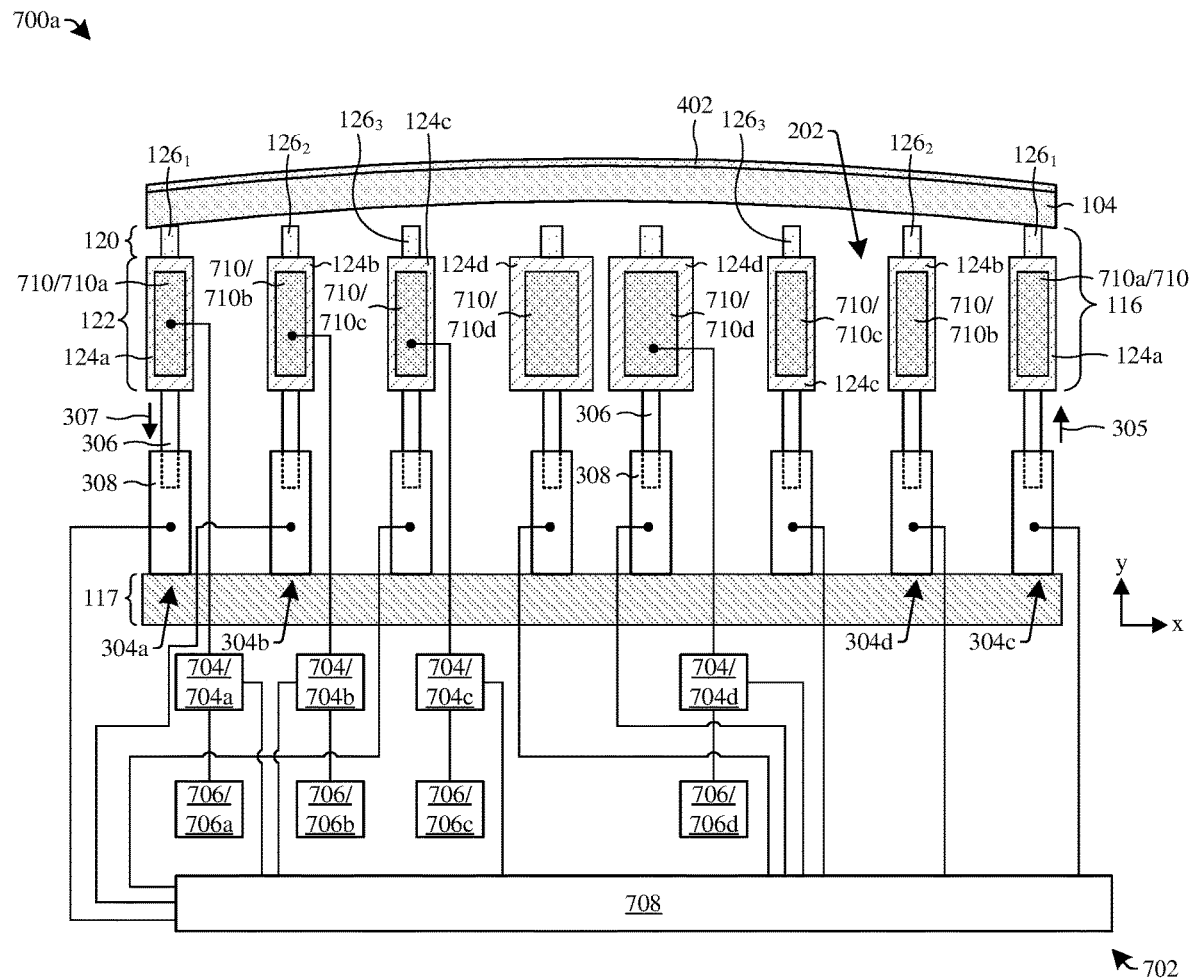
FIGS. 7A-7B illustrate diagrams of some embodiments of a system configured to operate some embodiments of the adjustable wafer chuck.
Figure 7B:
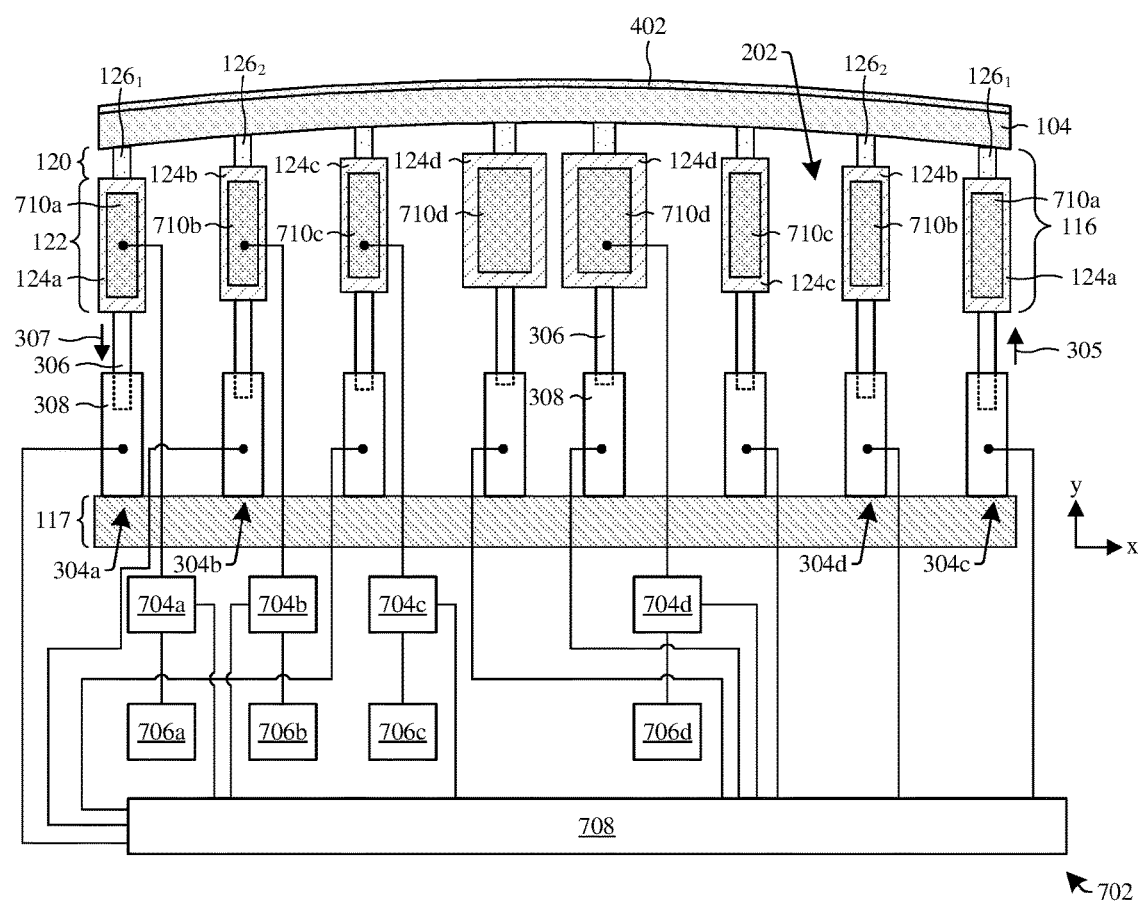

FIGS. 7A-7B illustrate diagrams 700a-700b of some embodiments of a system configured to operate some embodiments of the adjustable wafer chuck 116. More specifically, the diagram 700a of FIG. 7A illustrates the system 702 before the adjustable wafer chuck 116 has been adjusted to a warped wafer, and the diagram 700b of FIG. 7B illustrates the system 702 after the adjustable wafer chuck 116 has been adjusted to the shape of the warped wafer.

As shown in the diagrams 700a-700b of FIG. 7A-7B, the system 702 comprises the adjustable wafer chuck 116, the plurality of actuators 304, a plurality of sensors 704, a plurality of power supplies 706, and a controller 708. Also shown in the diagrams 700a-700b of FIG. 7A-7B, a plurality of chucking electrodes 710 are respectively disposed in the plurality of adjustable base structures 124. For example, the plurality of adjustable base structures 124 may comprise the first adjustable base structure 124a, the second adjustable base structure 124b, the third adjustable base structure 124c, and a fourth adjustable base structure 124d; and a first chucking electrode 710a of the plurality of chucking electrodes 710 is disposed in the first adjustable base structure 124a, a second chucking electrode 710b of the plurality of chucking electrodes 710 is disposed in the second adjustable base structure 124b, a third chucking electrode 710c of the plurality of chucking electrodes 710 is disposed in the third adjustable base structure 124c, and a fourth chucking electrode 710d of the plurality of chucking electrodes 710 is disposed in the fourth adjustable base structure 124d. In some embodiments, ESC circuitry (e.g., ESC circuitry 118) comprises the plurality of sensors 704, the plurality of power supplies 706, and/or the controller 708.

The plurality of power supplies 706 are electrically coupled to the plurality of chucking electrodes 710, respectively. For example, a first power supply 706a of the plurality of power supplies 706 is electrically coupled to the first chucking electrode 710a, a second power supply 706b of the plurality of power supplies 706 is electrically coupled to the second chucking electrode 710b, a third power supply 706c of the plurality of power supplies 706 is electrically coupled to the third chucking electrode 710c, and a fourth power supply 706d of the plurality of power supplies 706 is electrically coupled to the fourth chucking electrode 710d. The plurality of power supplies 706 are configured to provide power (e.g., an AC voltage signal, a DC voltage signal, etc.) to the plurality of chucking electrodes 710, respectively. For example, the first power supply 706a is configured to provide a first power signal (e.g., AC voltage signal) to the first chucking electrode 710a, the second power supply 706b is configured to provide a second power signal (e.g., AC voltage signal) to the second chucking electrode 710b, and so forth. In some embodiments, plurality of power supplies 706 are configured to respectively provide power to the plurality of chucking electrodes 710 to turn the adjustable wafer chuck "ON," thereby electrostatically clamping the wafer 104 to the adjustable wafer chuck 116. In some embodiments, the plurality of power supplies 706 may be discrete power units. It will be appreciated that, in other embodiments, the plurality of power supplies 706 may be portions of a larger power supply unit.

The plurality of power supplies 706 are electrically coupled to the plurality of chucking electrodes 710 via a plurality of electrical connectors. The plurality of electrical connectors are configured to provide electrical connections between the plurality of chucking electrodes 710 and the plurality of power supplies 706. In some embodiments, the plurality of electrical connectors may be or comprise, for example, DC connectors, AC connectors, barrel connectors, USB sockets, pin and socket connectors, some other types of electrical connectors, or a combination of the foregoing.

Each electrical connector of the plurality of electrical connectors couples to one of the plurality of chucking electrodes 710. For example, a first electrical connector provides an electrical connection to the first chucking electrode 710a, a second electrical connector provides an electrical connection to the second chucking electrode 710b, and so forth. In some embodiments, each electrical connector of the plurality of electrical connectors provides an electrical connection between one of the plurality of chucking electrodes 710 and one of the plurality of power supplies 706. For example, the first electrical connector provides an electrical connection between the first chucking electrode 710a and the first power supply 706a, the second electrical connector provides an electrical connection between the second chucking electrode 710b and the second power supply 706b, and so forth. In other embodiments, some of the electrical connectors of the plurality of electrical connectors provide electrical connections between one of the plurality of chucking electrodes 710 and another one of the plurality of chucking electrodes 710 (e.g., the electrical connectors may be configured so that the chucking electrodes are electrically coupled to a power supply in a daisy-chain manner). For example, the first electrical connector provides an electrical connection between the first chucking electrode 710a and the first power supply 706a, the second electrical connector provides an electrical connection between the first chucking electrode 710a and the second chucking electrode 710b, a third electrical connector provides an electrical connection between the second chucking electrode 710b and the third chucking electrode 710c, and so forth.

In some embodiments, the plurality of electrical connectors allow the plurality of adjustable base structures 124 to move along the plane (y-plane). For example, because the plurality of adjustable base structures 124 are configured to move along the plane (y-plane), some physical connections (e.g., a solid conductive structures disposed and extending laterally through a chuck) would not provide the means for the adjustable base structures 124 to move along the plane (y-plane) (e.g., the solid conductive structure would break if the adjustable base structures 124 moved along the plane). Thus, by having the plurality of electrical connectors, the adjustable base structures 124 may be able to move freely along the plane (y-plane) while maintaining electrical connections between the plurality of power supplies 706 and the plurality of chucking electrodes 710.

The plurality of sensors 704 are electrically coupled to the controller 708. The plurality of sensors 704 are configured to determine the distances in which the plurality of contact pads 126 are spaced from a surface (e.g., lower surface) of the wafer 104. In some embodiments, the plurality of sensors 704 are configured to determine the distances in which the plurality of chucking electrodes 710 are spaced from the surface of the wafer 104. The plurality of sensors 704 may be or comprise, for example, electrical sensors (e.g., voltage sensors, current sensors, etc.), capacitive sensors (e.g., proximity sensors), time-of-flight sensors, a ranging sensor, a force sensor, a pressure sensor, some other type of sensor, or a combination of the foregoing.

In some embodiments, the plurality of sensors 704 are configured to determine the distances in which the plurality of contact pads 126 are spaced from the surface of the wafer 104 by determining the distances in which the plurality of chucking electrodes 710 are spaced from the surface of the wafer 104. For example, a first sensor 704a of the plurality of sensors 704 is configured to determine a distance in which the first chucking electrode 710a is spaced from a lower surface of the wafer 104, a second sensor 704b of the plurality of sensors 704 is configured to determine a distance in which the second chucking electrode 710b is spaced from the lower surface of the wafer 104, a third sensor 704c of the plurality of sensors 704 is configured to determine a distance in which the third chucking electrode 710c is spaced from the lower surface of the wafer 104, and a fourth sensor 704d of the plurality of sensors 704 is configured to determine a distance in which the fourth chucking electrode 710d is spaced from the lower surface of the wafer 104.

The plurality of sensors 704 are configured to respectively generate a first plurality of electrical signals that correspond to the distances in which the plurality of chucking electrodes 710 are spaced from the surface of the wafer 104. For example, as shown in the diagram 700a of FIG. 7A, the first chucking electrode 710a is spaced from the lower surface of the wafer 104 by a first distance (e.g., 10 mm), the second chucking electrode 710b is spaced from the lower surface of the wafer 104 by a second distance (e.g., 10.5 mm), the third chucking electrode 710c is spaced from the bottom surface of the wafer 104 by a third distance (e.g., 11 mm), and so forth. As such, the first sensor 704a generates a first electrical signal that corresponds to the first distance, the second sensor 704b generates a second electrical signal that corresponds to the second distance, the third sensor 704c generates a third electrical signal that corresponds to the third distance, and so forth. The plurality of sensors 704 are configured to provide the first plurality of electrical signals to the controller 708.

It will be appreciated that the first plurality of electrical signals that correspond to the distances in which the plurality of chucking electrodes 710 are spaced from the surface of the wafer 104 may also translate to the distances in which the plurality of contact pads 126 are spaced from a surface of the wafer 104. For example, the distances in which the plurality of chucking electrodes 710 are spaced from the surface of the wafer 104 may be translated to the distances in which the plurality of contact pads 126 are spaced from a surface of the wafer 104 by factoring in the distances in which the plurality of contact pads 126 are respectively spaced from the plurality of chucking electrodes 710. In such embodiments, the controller 708 may be configured to factor in the distances in which the plurality of contact pads 126 are respectively spaced from the plurality of chucking electrodes 710.

In some embodiments, the plurality of sensors 704 are configured to determine the distances in which the plurality of chucking electrodes 710 are spaced from the surface of the wafer 104 by measuring the electrical resistances between the plurality of chucking electrodes 710 and the plurality of power supplies 706. For example, the first sensor 704a is configured to determine an electrical resistance between the first chucking electrode 710a and the first power supply 706a, the second sensor 704b is configured to determine an electrical resistance between the second chucking electrode 710b and the second power supply 706b, and so forth. In further embodiments, the plurality of sensors 704 are electrically coupled between their corresponding chucking electrode and their corresponding power supply. For example, the first sensor 704a is electrically coupled between the first chucking electrode 710a and the first power supply 706a (e.g., electrically coupled along an electrical connection (e.g., wire) between the first chucking electrode 710a and the first power supply 706a), the second sensor 704b is electrically coupled between the second chucking electrode 710b and the second power supply 706b, and so forth.

The controller 708 is configured to receive the first plurality of electrical signals from the plurality of sensors 704. In some embodiments, the controller 708 is configured to generate a second plurality of electrical signals based on the first plurality of electrical signals. For example, the controller 708 receives the first electrical signal from the first sensor 704a and generates a fourth electrical signal that corresponds to the first electrical signal, the controller 708 receives the second electrical signal from the second sensor 704b and generates a fifth electrical signal that corresponds to the second electrical signal, the controller 708 receives the third electrical signal from the third sensor 704c and generates a sixth electrical signal that corresponds to the third electrical signal, and so forth. In further embodiments, the controller 708 is configured to provide the second plurality of electrical signals to the plurality of actuators 304. For example, the controller 708 is configured to provide the fourth electrical signal to the first actuator 304a, the controller 708 is configured to provide the fifth electrical signal to the second actuator 304b, the controller 708 is configured to provide the sixth electrical signal to the third actuator 304c, and so forth.

The plurality of actuators 304 are configured to receive the second plurality of electrical signals. As shown in the diagram 700b of FIG. 7B, the plurality of actuators 304 are configured to move their corresponding extension structure 306 in response to receiving the second plurality of electrical signals, which moves their corresponding adjustable base structure a predefined distance. As such, the distances in which the plurality of contact pads 126 are spaced from the surface of the wafer 104 may be reduced. In other words, the adjustable wafer chuck 116 is adjusted to compensate for a warped wafer by reducing the distances in which the plurality of contact pads 126 are spaced from the surface of the wafer 104. It will also be appreciated that the plurality of actuators 304 are configured to move their corresponding extension structure 306 to increase the distances in which the plurality of contact pads 126 are spaced from the surface of the wafer 104. In other words, the adjustable wafer chuck 116 is adjusted to compensate for a warped wafer by reducing and/or increasing the distances in which the plurality of contact pads 126 are spaced from the surface of the wafer 104.

For example, the first sensor 704a provides the first electrical signal to the controller 708 and the second sensor 704b provides the second electrical signal to the controller 708. The controller 708 may analyze the first electrical signal to determine the distance in which the first group of contact pads $126_1$ are spaced from the warped wafer (e.g., 0 mm, as shown in the diagram 7A of FIG. 7A), and the controller 708 may analyze the second electrical signal to determine the distance in which the second group of contact pads $126_2$ are spaced from the warped wafer (e.g., 0.5 mm, as shown in the diagram 7A of FIG. 7A).

In some embodiments, the controller 708 generates a fourth electrical signal that corresponds to the first electrical signal and provides the fourth electrical signal to the first actuator 304a and generates a seventh electrical signal that corresponds to the first electrical signal and provides the seventh electrical signal to the third actuator 304c. In other embodiments, if the controller 708 analyzes the first and second electrical signals and determines that one of the electrical signals (e.g., the first electrical signal) indicates that one of the plurality of groups of contact pads 126₁-126₃ (e.g., the first group of contact pads 126₁) are already within a predefined range (e.g., 0 mm to 0.2 mm), the controller 708 may not provide an electrical signal to the either of the first actuator 304a or the third actuator 304c (e.g., an electrical signal may not need to be provided to either of these actuators because they do not need to adjust their corresponding adjustable base structure to move it closer to (or further away from) the lower surface of the wafer 104). In some embodiments, the controller 708 generates a fifth electrical signal that corresponds to the second electrical signal and provides the fifth electrical signal to the second actuator 304b and generates an eighth electrical signal that corresponds to the second electrical signal and provides the eighth electrical signal to the fourth actuator 304d. In response to receiving the fifth electrical signal and the eighth electrical signal, the second actuator 304b and the fourth actuator 304d move their corresponding extension structure 306 a corresponding distance, which moves the second adjustable base structure 124b along the plane (y-plane) a predefined distance (e.g., 0.5 mm in the first direction 305). As a result, the distance in which the second group of contact pads 126₂ is spaced may be reduced (or increased).

Figure 8:
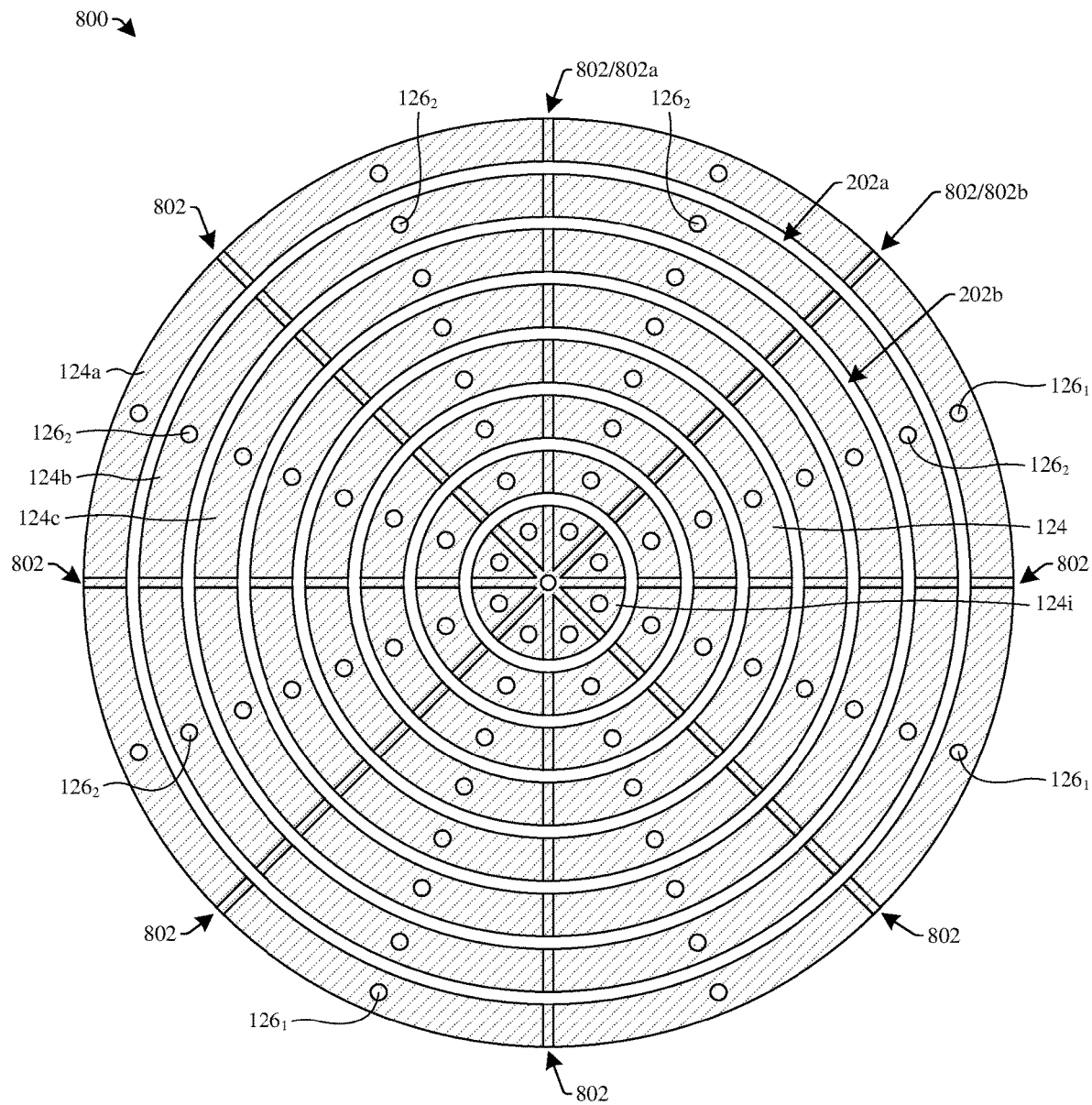
FIG. 8 illustrates a top view of some other embodiments of the adjustable wafer chuck.

FIG. 8 illustrates a top view 800 of some other embodiments of the adjustable wafer chuck 116.

As shown in the top view 800 of FIG. 8, a plurality of grooves 802 may be disposed in the plurality of adjustable base structures 124. For example, a first groove 802a may be disposed in the plurality of adjustable base structures 124, a second groove 802b may be disposed in the plurality of adjustable base structures 124, and so forth. In some embodiments, the plurality of grooves 802 are configured to direct the flow of processing gases (e.g., argon (Ar)) through the adjustable wafer chuck 116.

Also shown in the top view 800 of FIG. 8, the plurality of grooves 802 are defined by a plurality of sub-groove structures disposed in the plurality of adjustable base structures 124. For example, the first groove 802a is defined by a first sub-groove structure disposed in the first adjustable base structure 124a, a first sub-groove structure disposed in the second adjustable base structure 124b, a first sub-groove structure disposed in the third adjustable base structure 124c, and so forth; and the second groove 802b is defined by a second sub-groove structure disposed in the first adjustable base structure 124a, a second sub-groove structure disposed in the second adjustable base structure 124b, a second sub-groove structure disposed in the third adjustable base structure 124c, and so forth.

In some embodiments, the plurality of sub-groove structures are aligned, such that the plurality of grooves 802 extend radially in predefined directions away from a center point of the innermost adjustable base structure 124i (e.g., the plurality of grooves 802 extend along radial planes that intersect the center point of the innermost adjustable base structure 124i). For example, the first sub-groove structures disposed in the plurality of adjustable base structures 124 are aligned so that the first groove 802a extends radially in a first direction from the center point of the innermost adjustable base structure 124i, the second sub-groove structures disposed in the plurality of adjustable base structures 124 are aligned so that the second groove 802b extends radially in a second direction (e.g., rotated about 45 degrees from the first direction) from the center point of the innermost adjustable base structure 124i, and so forth.

Figure 9:
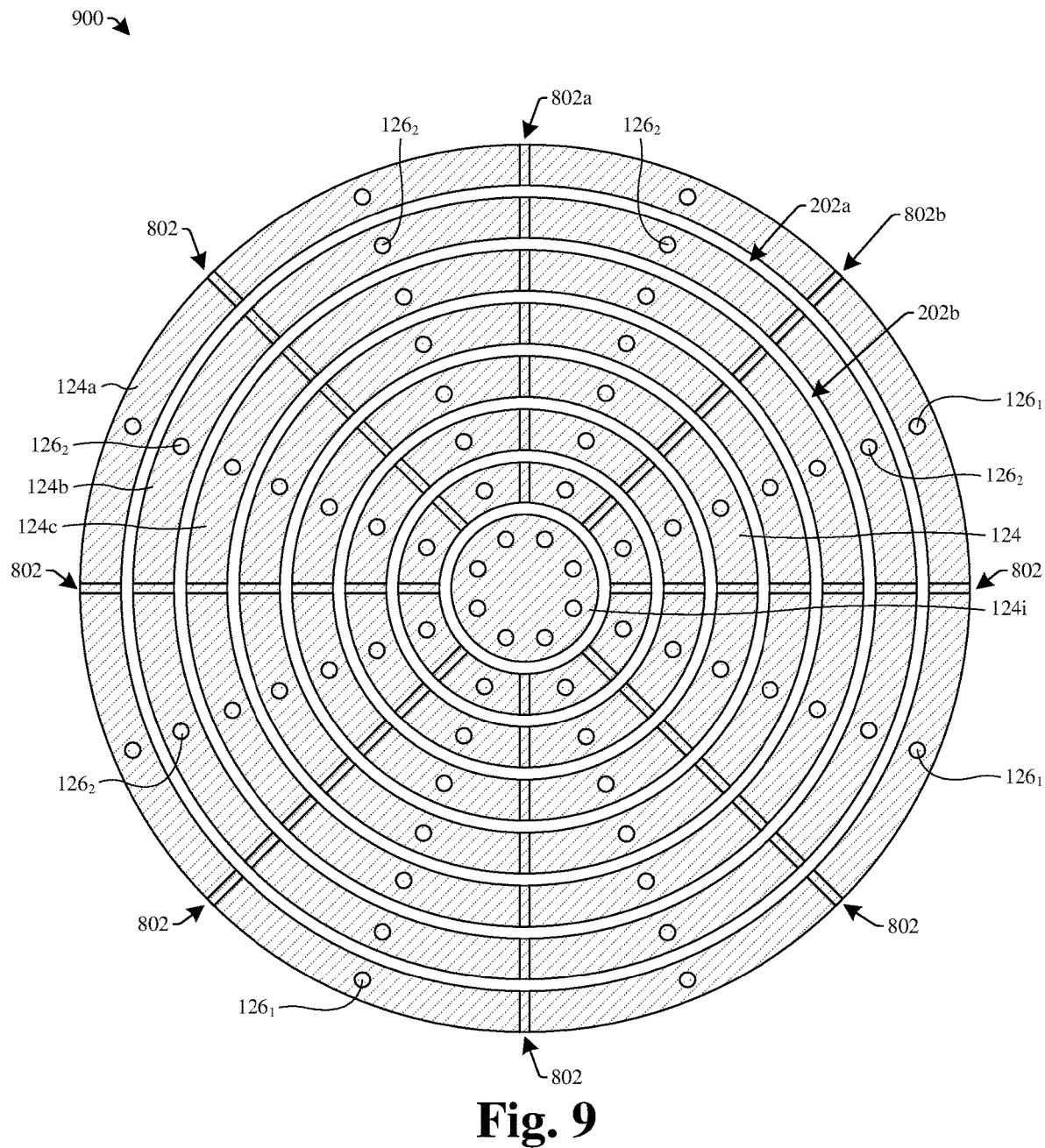
FIG. 9 illustrates a top view of some other embodiments of the adjustable wafer chuck.

FIG. 9 illustrates a top view 900 of some other embodiments of the adjustable wafer chuck 116.

As shown in the top view 900 of FIG. 9, in some embodiments, the innermost adjustable base structure 124i may have a disc-like shape (instead of a ring-like shape). Also shown in top view 900 of FIG. 9, in some embodiments, the plurality of grooves 802 may be disposed in each of the plurality of adjustable base structures 124 except the innermost adjustable base structure 124i.

Figure 10:
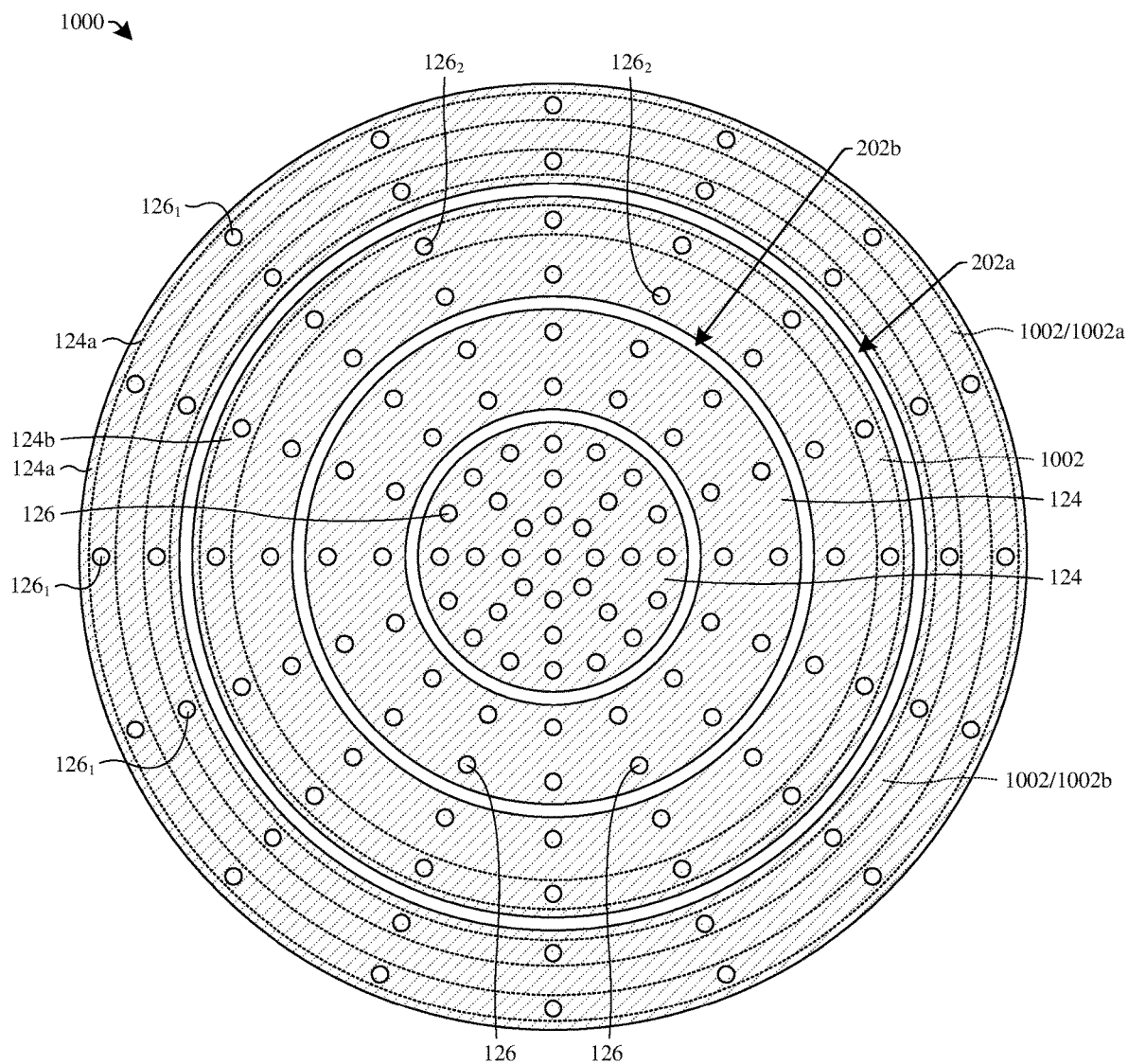
FIG. 10 illustrates a top view of some other embodiments of the adjustable wafer chuck.

FIG. 10 illustrates a top view 1000 of some other embodiments of the adjustable wafer chuck 116.

As shown in the top view 1000 of FIG. 10, in some embodiments, one or more of the groups of contact pads 126₁-126₂ comprises a plurality of rows of contact pads 1002a-1002b. For example, the first group of contact pads 126₁ comprises a first row of contact pads 1002a and a second row of contact pads 1002b. In some embodiments, the rows of the plurality of rows of contact pads 1002a-1002b are concentric rows, as illustrated in the top view 1000 of FIG. 10. While the top view 1000 of FIG. 10 illustrates the first group of contact pads 126₁ comprising two rows of contacts pads, it will be appreciated that the first group of contact pads 126₁ (and/or any other of the one or more of the groups of contact pads 126₁-126₂) may comprise any number of rows of contact pads (e.g., 3 rows, 4 rows, 5 rows, etc.). For clarity in the figures, only some of the plurality of rows of contact pads 1002a-1002b are labeled in FIG. 10.

Figure 11:
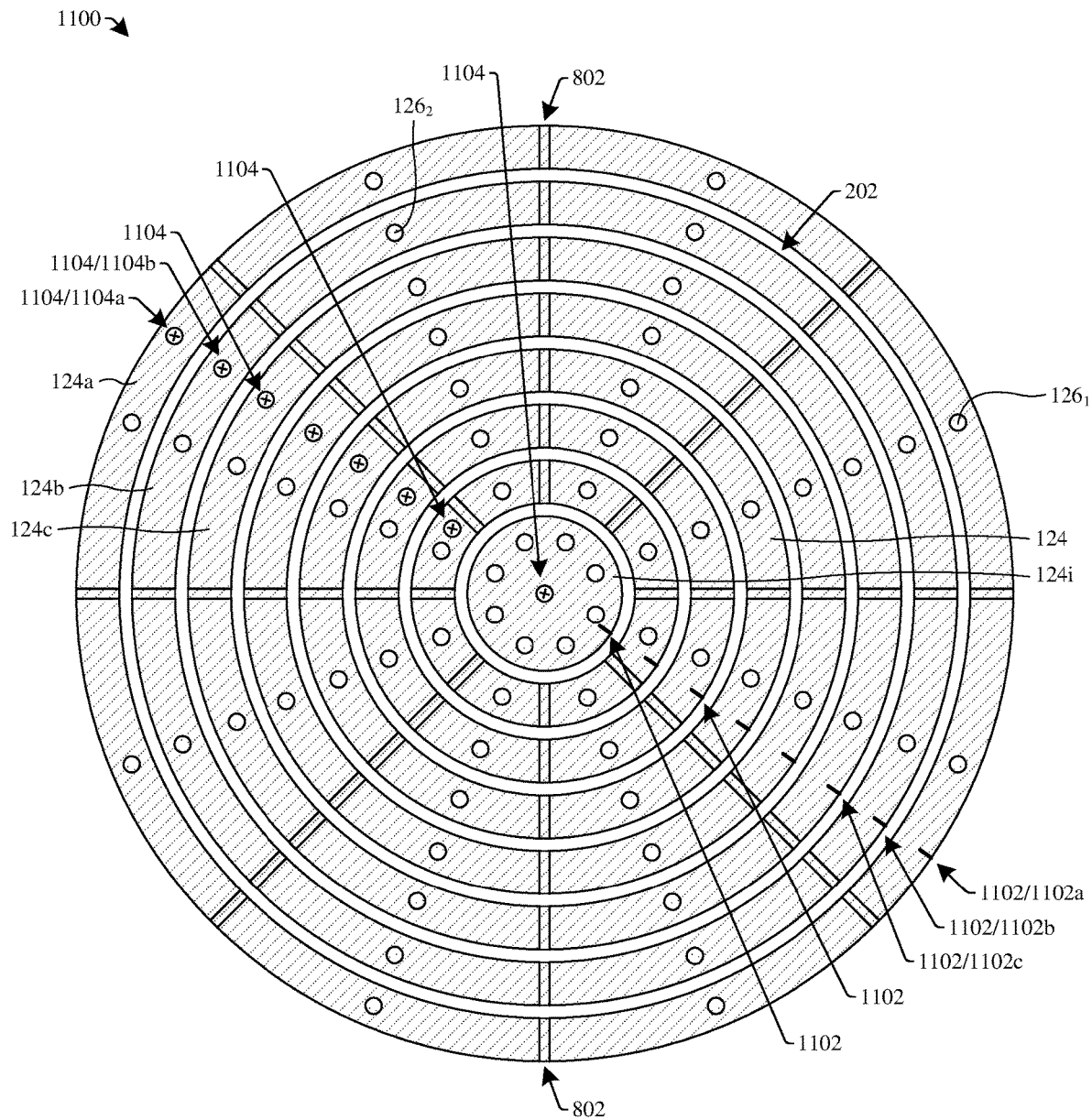
FIG. 11 illustrates a top view of some other embodiments of the adjustable wafer chuck.

FIG. 11 illustrates a top view 1100 of some other embodiments of the adjustable wafer chuck 116.

As shown in the top view 1100 of FIG. 11, in some embodiments, a first plurality of alignment indicators 1102 may be disposed on the plurality of adjustable base structures 124, respectively. For example, a first alignment indicator 1102a is disposed on the first adjustable base structure 124a, a second alignment indicator 1102b is disposed on the second adjustable base structure 124b, a third alignment indicator 1102c is disposed on the third adjustable base structure 124c, and so forth. In some embodiments, the first plurality of alignment indicators 1102 may be structures disposed in the plurality of adjustable base structures 124 (e.g., indicator structures (such as an arrows, divots, lines, grooves, etc.) embossed into the adjustable base structures). In other embodiments, the first plurality of alignment indicators 1102 may be structures disposed on the plurality of adjustable base structures 124 (e.g., indicator structures (such as an arrows, bumps, lines, grooves, etc.) that protrude from (or are disposed on surfaces of) the adjustable base structures). The first plurality of alignment indicators 1102 are utilized (e.g., by a user) to align the adjustable base structures 124 in a predefined manner. For example, the first plurality of alignment indicators 1102 allow a user to easily align the adjustable base structures 124 so that the sub-groove structures are appropriately aligned along their corresponding radial plane.

Also shown in the top view 1100 of FIG. 11, in some embodiments, a plurality of fastening structures 1104 are disposed on/in the plurality of adjustable base structures 124, respectively. In some embodiments, the plurality of fastening structures 1104 may be, for example, bolt-type fasteners, screw-type fasteners, pin-type fasteners, clamplike fasteners, some other type of fasteners, or a combination of the foregoing. The plurality of fastening structures 1104 are configured to fasten the plurality of adjustable base structures 124 to a mounting structure. For example, in some embodiments, the mounting structure may be a chuck pedestal 117 comprising a plurality of pedestal structures 214 (see, e.g., FIGS. 2A-2B). The plurality of pedestal structures 214 comprises a first pedestal structure 214a, a second pedestal structure 214b, and so forth. A first fastening structure 1104a (e.g., machine screw) engages the first adjustable base structure 124a (e.g., via threads in the first adjustable base structure 124a) and fastens the first adjustable base structure 124a to the first pedestal structure 214a (e.g., via threads in the first pedestal structure 214a); a second fastening structure 1104b engages the second adjustable base structure 124b and fastens the second adjustable base structure 124b to the second pedestal structure 214b; and so forth.

Because the adjustable wafer chuck 116 comprises the first plurality of alignment indicators 1102 and/or because the adjustable wafer chuck 116 is configured to be fastened via the plurality of fastening structures 1104, the adjustable wafer chuck 116 may be easier to repair than a typical wafer chuck. For example, once the plurality of contact pads of a typical wafer chuck reaches a predetermined amount of wear, the entire wafer chuck may have to be removed from its processing chamber (even though some portions of the typical wafer chuck are still in good working condition) and sent to a specialized processing facility to repair the plurality of contact pads on the typical wafer chuck. On the other hand, once the plurality of contact pads 126 reach a predetermined level of wear, a user may simply unfasten one or more of the plurality of adjustable base structures 124 and replace them with new adjustable base structures. Accordingly, the adjustable wafer chuck 116 may decrease a cost to fabricate ICs (e.g., by reducing downtime, reducing repair cost, reducing material waste, etc.).

Figure 12:
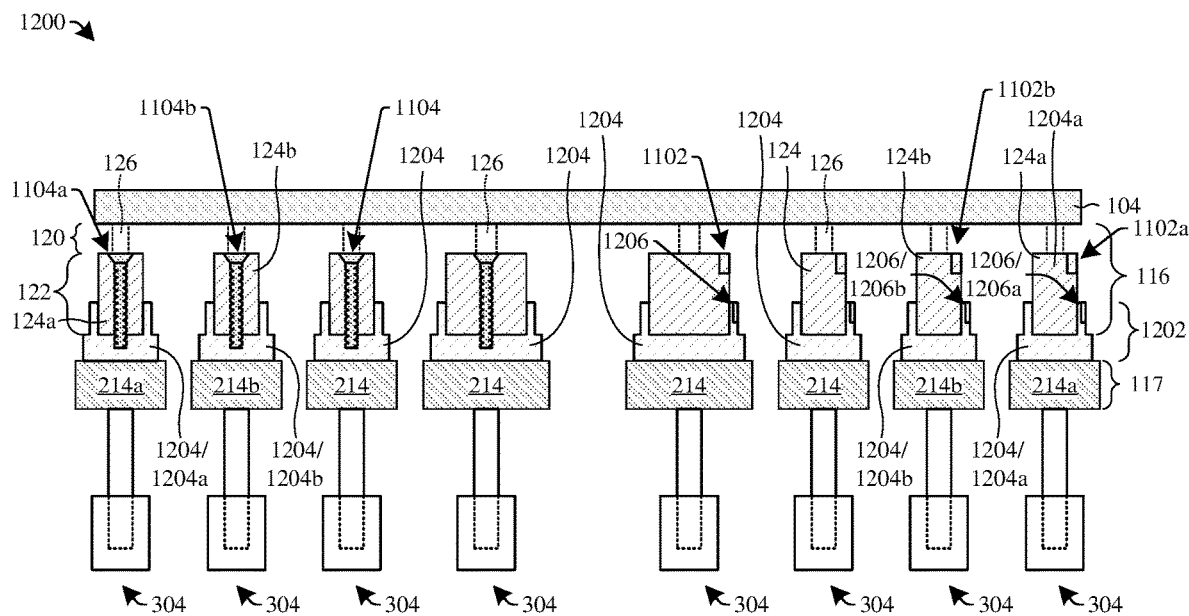
FIG. 12 illustrates a cross-sectional view of some embodiments of the adjustable wafer chuck.

FIG. 12 illustrates a cross-sectional view 1200 of some embodiments of the adjustable wafer chuck 116.

As shown in the cross-sectional view 1200 of FIG. 12, a support structure 1202 is disposed between the chuck pedestal 117 and the plurality of adjustable base structures 124. The support structure 1202 is affixed to the chuck pedestal 117. In some embodiments, the support structure 1202 may comprise a plurality of individual support structures 1204. For example, the support structure 1202 may comprise a first individual support structure 1204a, a second individual support structure 1204b, and so forth. In some embodiments, the plurality of individual support structures 1204 are respectively disposed on (e.g., affixed to) the plurality of pedestal structures 214. For example, the first individual support structure 1204a is disposed on the first pedestal structure 214a, the second individual support structure 1204b is disposed on the second pedestal structure 214b, and so forth.

The plurality of adjustable base structures 124 are configured to engage the support structure 1202. In some embodiments, the plurality of adjustable base structures 124 are configured to engage the plurality of individual support structures 1204, respectively. For example, the first adjustable base structure 124a is configured to engage the first individual support structure 1204a, the second adjustable base structure 124b is configured to engage the second individual support structure 1204b, and so forth.

In further embodiments, the plurality of adjustable base structures 124 are configured to be fastened to the support structure 1202 via the plurality of fastening structures 1104 (e.g., the plurality of fastening structures 1104 engaging threads disposed in the support structure 1202). In other words, the support structure 1202 may be the mounting structure (e.g., the structure in which the plurality of adjustable base structures 124 are fastened to via the plurality of fastening structures 1104). In yet further embodiments, the plurality of adjustable base structures 124 are configured to be fastened to the plurality of individual support structures 1204, respectively. For example, the first adjustable base structure 124a is configured to be fastened to the first individual support structure 1204a via the first fastening structure 1104a, the second adjustable base structure 124b is configured to be fastened to the second individual support structure 1204b via the second fastening structure 1104b, and so forth.

Also shown in the cross-sectional view 1200 of FIG. 12, in some embodiments, a second plurality of alignment indicators 1206 may be disposed in/on the support structure 1202. In further embodiments, the second plurality of alignment indicators 1206 may be disposed on the plurality of individual support structures 1204, respectively. For example, a fourth alignment indicator 1206a is disposed on the first individual support structure 1204a, a fifth alignment indicator 1206b is disposed on the second individual support structure 1204b, and so forth. In some embodiments, the second plurality of alignment indicators 1206 may be structures disposed in the plurality of individual support structures 1204 (e.g., indicator structures (such as an arrows, divots, lines, grooves, etc.) embossed into the individual support structures). In other embodiments, the second plurality of alignment indicators 1206 may be structures disposed on the plurality of individual support structures 1204 (e.g., indicator structures (such as an arrows, bumps, lines, grooves, etc.) that protrude from (or are disposed on surfaces of) the individual support structures).

The first plurality of alignment indicators 1102 and the second plurality of alignment indicators 1206 may be utilized (e.g., by a user) to align the adjustable base structures 124 in a predefined manner. For example, by aligning the first plurality of alignment indicators 1102 with the second plurality of alignment indicators 1206, respectively, the adjustable base structures 124 may be aligned so that the sub-groove structures are appropriately aligned along their corresponding radial plane. While the cross-sectional view 1200 of FIG. 12 illustrates the second plurality of alignment indicators 1206 disposed in the support structure 1202, it will be appreciated that, in other embodiments, the second plurality of alignment indicators 1206 may be disposed on/in the chuck pedestal (e.g., in embodiments in which the mounting structure is the chuck pedestal 117).

Figure 13:
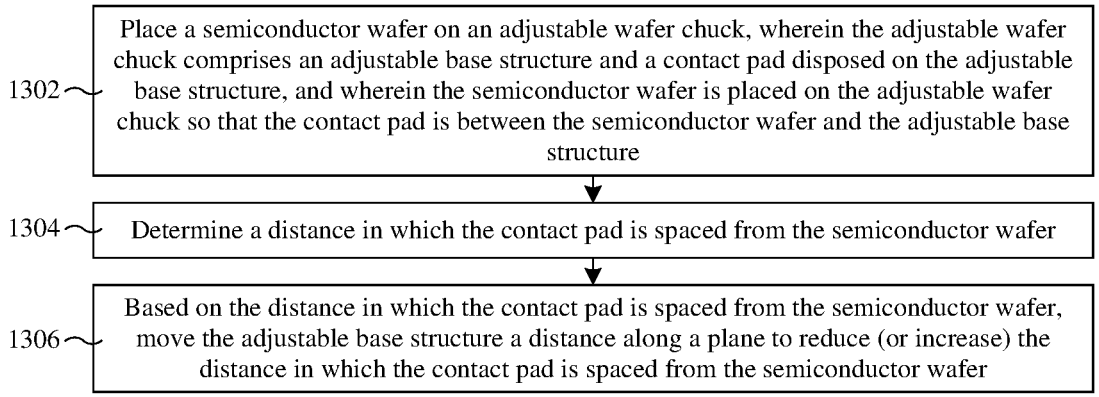
FIG. 13 illustrates a flowchart of some embodiments of a method for operating a system comprising an adjustable wafer chuck.

FIG. 13 illustrates a flowchart 1300 of some embodiments of a method for operating a system comprising an adjustable wafer chuck. While the flowchart 1300 of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1302, a semiconductor wafer (e.g., the wafer 104) is placed on an adjustable wafer chuck (e.g., the adjustable wafer chuck 116). The adjustable wafer chuck comprises an adjustable base structure (e.g., one of the plurality of adjustable base structures 124) and a contact pad (e.g., one of the plurality of contact pads 126) that is disposed on the adjustable base structure. The semiconductor wafer is placed on the adjustable wafer chuck so that the contact pad is between the semiconductor wafer and the adjustable base structure (see, e.g., FIGS. 1A-1B).

At act 1304, a distance in which the contact pad is spaced (e.g., vertically spaced) from the semiconductor wafer is determined (see, e.g., the system 702 of FIGS. 7A-7B). In some embodiments, the distance in which the contact pad is spaced from the semiconductor wafer is determined when the adjustable wafer chuck is "ON" (e.g., when a power supply is applying power to a chucking electrode to electrostatically clamp the wafer to the adjustable wafer chuck).

At act 1306, based on the distance in which the contact pad is spaced from the semiconductor wafer, the adjustable base structure is moved (see, e.g., the system 702 of FIGS. 7A-7B) to reduce (or increase) the distance in which the contact pad is spaced from the semiconductor wafer.

By moving the adjustable base structure to reduce (or increase) the distance in which the contact pad is spaced from the semiconductor wafer, in comparison to a typical wafer chuck having a contact pad (e.g., non-adjustable wafer chuck), the contact pad of the adjustable wafer chuck may be less prone to premature wear. Thus, in comparison to a typical wafer chuck, the adjustable wafer chuck may decrease a cost to fabricate ICs (e.g., improve productivity, decrease maintenance costs, etc.).

It will be appreciated that, in some embodiments (e.g., the contact pad is spaced too close to the semiconductor wafer), the adjustable base structure may be moved to increase the distance in which the contact pad is spaced from the semiconductor wafer. For example, in some embodiments, it may be determined that the distance in which the contact pad is spaced from the semiconductor wafer is too small. In such embodiments, the adjustable base structure may be moved to increase the distance in which the contact pad is spaced from the semiconductor wafer. As such, it will be appreciated that the adjustable base structure may be moved in a first direction (e.g., first direction 305) along the plane and/or a second direction (e.g., second direction 307) along the plane. Further, while the flowchart 1300 of FIG. 13 only describes adjusting one adjustable base structure of an adjustable wafer chuck, it will be appreciated that the adjustable wafer cuck may comprise a plurality of base structure that may be independently adjusted in a substantially similar manner as described above.

Figure 14:
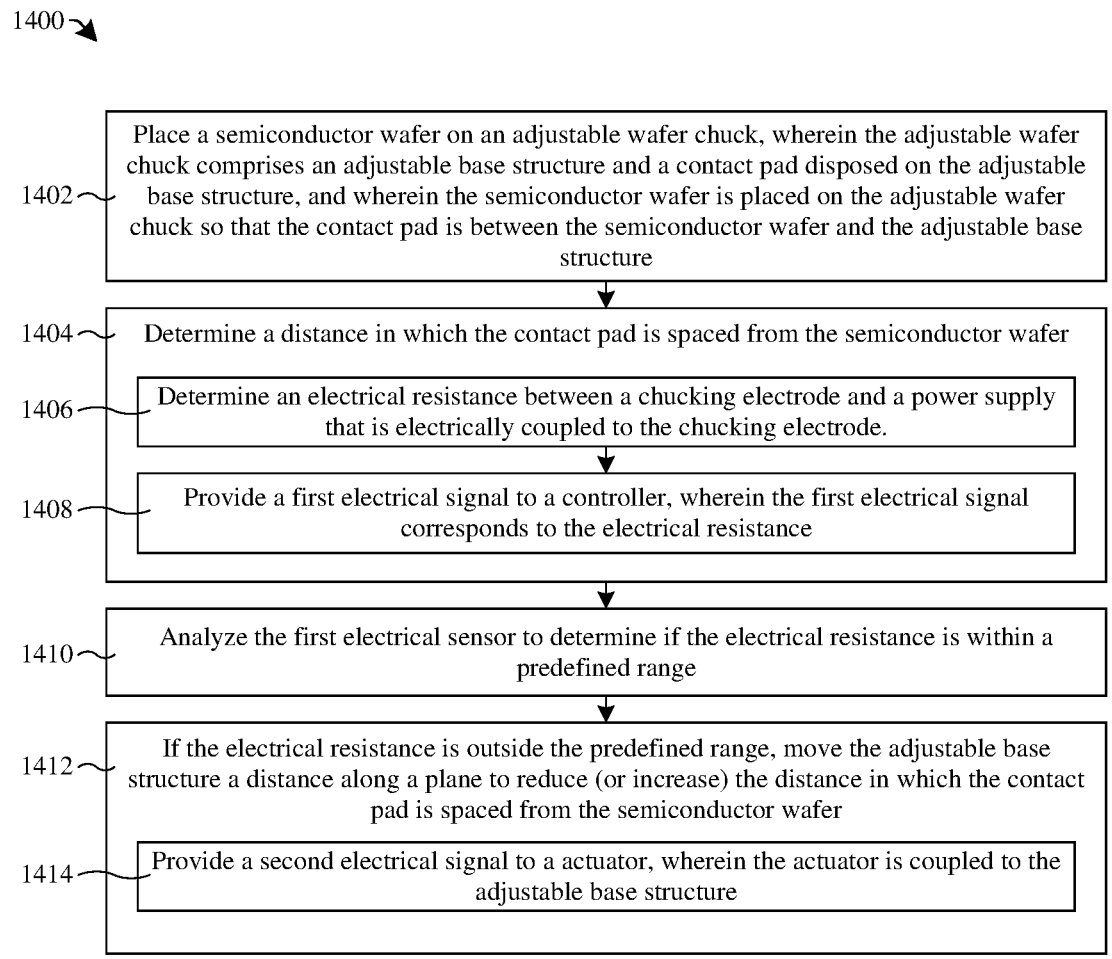
FIG. 14 illustrates a flowchart of some other embodiments of a method for operating a system comprising the adjustable wafer chuck.

FIG. 14 illustrates a flowchart 1400 of some other embodiments of a method for operating a system comprising the adjustable wafer chuck. While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1402, a semiconductor wafer (e.g., the wafer 104) is placed on an adjustable wafer chuck (e.g., the adjustable wafer chuck 116). The adjustable wafer chuck comprises an adjustable base structure (e.g., the second adjustable base structure 124b) and a contact pad (e.g., one of the plurality of contact pads 126) that is disposed on the adjustable base structure. The semiconductor wafer is placed on the adjust- able wafer chuck so that the contact pad is between the semiconductor wafer and the adjustable base structure (see, e.g., FIGS. 1A-1B).

At act 1404, a distance in which the contact pad is spaced (e.g., vertically spaced) from the semiconductor wafer is determined (see, e.g., the system 702 of FIGS. 7A-7B). In some embodiments, act 1404 comprises act 1406 and act 1408.

At act 1406, an electrical resistance between a chucking electrode (e.g., the second chucking electrode 710b) and a power supply (e.g., the second power supply 706b) that is electrically coupled to the chucking electrode is determined. In some embodiments, the chucking electrode is disposed in the adjustable base structure. In some embodiments, the electrical resistance between the chucking electrode and the power supply is determined via a sensor (e.g., the second sensor 704b). In some embodiments, the electrical resistance between the chucking electrode and the power supply is determined when the adjustable wafer chuck is "ON" (e.g., when the power supply is applying power to the chucking electrode to electrostatically clamp the wafer to the adjustable wafer chuck).

At act 1408, a first electrical signal (e.g., a voltage pulse, current pulse, etc.) is provided to a controller (e.g., the controller 708). The first electrical signal corresponds to the electrical resistance. For example, if the electrical resistance is a first value (e.g., 100 ohms ($\Omega$)), the first electrical signal may comprise a first signal characteristic (e.g., a first voltage magnitude, a first pulse width, a first combination of bit(s), etc.); and if the electrical resistance is a second value (e.g., 200$\Omega$) different than the first value, the first electrical signal may comprise a second signal characteristic different than the first signal characteristic (e.g., a second voltage magnitude, a second pulse width, a second combination of bit(s), etc.). In some embodiments, the sensor provides the first electrical signal to the controller.

At act 1410, the first electrical signal is analyzed to determine if the electrical resistance is within a predefined range. In some embodiments, the controller analyzes the first electrical signal to determine if the electrical resistance is within the predefined range.

For example, in some embodiments, the controller comprises a storage structure (e.g., flash memory) that stores the predefined range (e.g., a range of voltage magnitudes, a range of voltage pulse widths, a set of combinations of bit(s), etc.). The controller may compare the first electrical signal to the predefined range to determine if the electrical resistance is within the predefined range (e.g., the controller compares the electrical characteristic of the first electrical signal to the stored electrical characteristics that define the predefined range to determine if the first electrical signal is indicating that the electrical resistance is within the predefined range).

At act 1412, if the electrical resistance is outside the predefined range, the adjustable base structure is moved (see, e.g., the system 702 of FIGS. 7A-7B) a distance along a plane (e.g., the y-plane) to reduce (or increase) the distance in which the contact pad is spaced from the semiconductor wafer. In some embodiments, act 1412 comprises act 1414.

At act 1414, a second electrical signal is provided to an actuator (e.g., the second actuator 304b). The actuator is coupled to the adjustable base structure. In some embodiments, the controller provides the second electrical signal to the actuator. The actuator is configured to receive the second electrical signal from the controller. In response to receiving the second electrical signal, the actuator moves its extension structure (e.g., the extension structure 306 of the second actuator 304b) a first predefined distance. The first predefined distance corresponds to the second electrical signal. In other words, the signal characteristic (e.g., a voltage magnitude, a pulse width, a combination of bit(s), etc.) of the second electrical signal indicates the value (e.g., 0.5 mm, 1 mm, 2 mm, etc.) of the first predefined distance. Because the actuator is coupled to the adjustable base structure, and because the actuator moves its extension structure the first predefined distance in response to receiving the second electrical signal, the second electrical signal causes the adjustable base structure to move a second predefined distance along the plane.

In some embodiments, the second predefined distance is equal to the distance in which the contact pad is spaced from the semiconductor wafer (see, e.g., act 1404). In other embodiments, the second predefined distance is different than the distance in which the contact pad is spaced from the semiconductor wafer. In some embodiments, the first predefined distance is the same as the second predefined distance. In other embodiments, the first predefined distance is different than the second predefined distance. By moving the adjustable base the second predefined distance along the plane, in comparison to a typical wafer chuck having a contact pad (e.g., non-adjustable wafer chuck), the contact pad of the adjustable wafer chuck may be less prone to premature wear. Thus, in comparison to a typical wafer chuck, the adjustable wafer chuck may decrease a cost to fabricate ICs (e.g., improve productivity, decrease maintenance costs, etc.).

It will be appreciated that, in some embodiments (e.g., the contact pad is spaced too close to the semiconductor wafer), the adjustable base structure may be moved to increase the distance in which the contact pad is spaced from the semiconductor wafer. For example, in some embodiments, it may be determined that the electrical resistance is outside the predefined range in such a manner that the contact pad is spaced from the semiconductor wafer by too small of a distance. In such embodiments, the adjustable base structure may be moved to increase the distance in which the contact pad is spaced from the semiconductor wafer. As such, it will be appreciated that the adjustable base structure may be moved in a first direction (e.g., first direction 305) along the plane and/or a second direction (e.g., second direction 307) along the plane. Further, while the flowchart 1400 of FIG. 14 only describes adjusting one adjustable base structure of an adjustable wafer chuck, it will be appreciate that the adjustable wafer cuck may comprise a plurality of base structure that may be independently adjusted in a substantially similar manner as described above.

Figure 15:
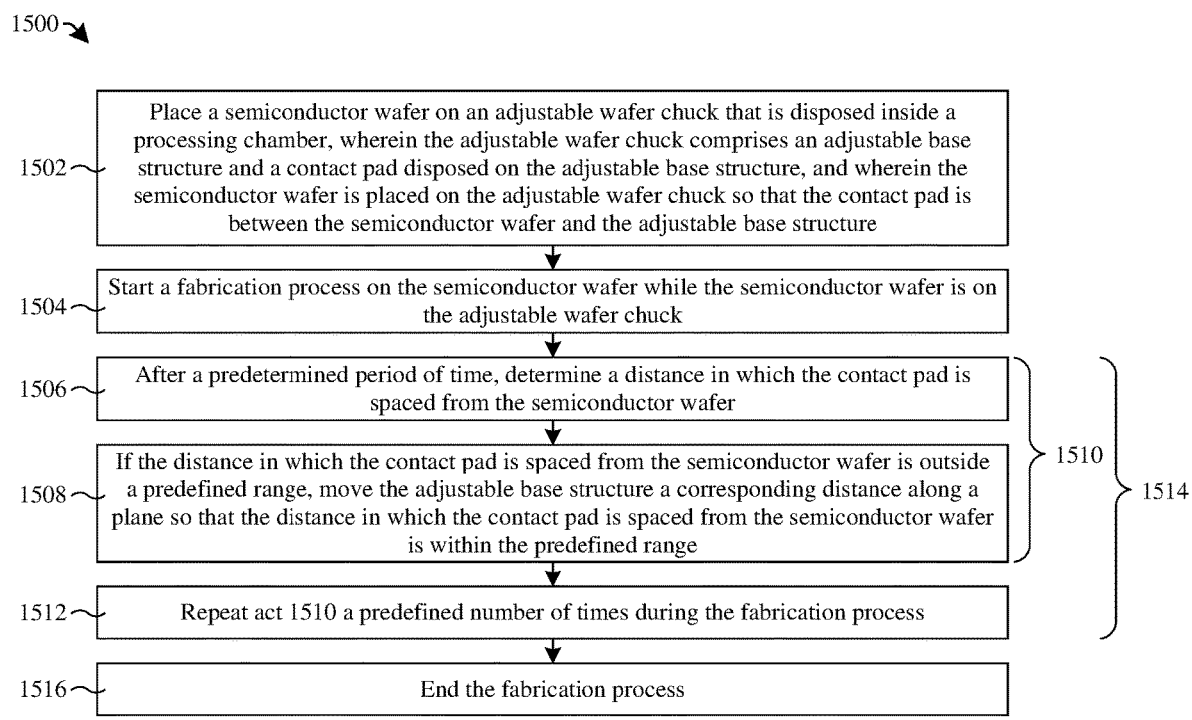
FIG. 15 illustrates a flowchart of some other embodiments of a method for operating a system comprising the adjustable wafer chuck.

FIG. 15 illustrates a flowchart 1500 of some other embodiments of a method for operating a system comprising the adjustable wafer chuck. While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1502, a semiconductor wafer (e.g., the wafer 104) is placed on an adjustable wafer chuck (e.g., the adjustable wafer chuck 116) that is disposed inside a processing chamber (e.g., chamber housing 102). The adjustable wafer chuck comprises an adjustable base structure (e.g., the second adjustable base structure 124b) and a contact pad (e.g., one of the plurality of contact pads 126) that is disposed on the adjustable base structure. The semiconductor wafer is placed on the adjustable wafer chuck so that the contact pad is between the semiconductor wafer and the adjustable base structure (see, e.g., FIGS. 1A-1B).

At act 1504, a fabrication process (e.g., a PVD deposition process) is started on the semiconductor wafer while the semiconductor wafer is on the adjustable wafer chuck.

At act 1506, after a period of time (e.g., 0.1 seconds, 0.5 seconds, 1 second, 10 seconds, etc.), a distance in which the contact pad is spaced (e.g., vertically spaced) from the semiconductor wafer is determined (see, e.g., the system 702 of FIGS. 7A-7B). In some embodiments, the distance in which the contact pad is spaced from the semiconductor wafer is determined when the adjustable wafer chuck is "ON" (e.g., when a power supply is applying power to a chucking electrode to electrostatically clamp the wafer to the adjustable wafer chuck). In some embodiments, act 1506 may comprise act 1406 and/or act 1408 (see, e.g., FIG. 14).

At act 1508, if the distance in which the contact pad is spaced from the semiconductor wafer is outside a predefined range, the adjustable base structure is moved a distance along a plane (e.g., y-plane) so that the distance in which the contact pad is spaced from the semiconductor wafer is within the predefined range. In some embodiments in which the distance in which the contact pad is spaced from the semiconductor wafer is outside the predefined range, the adjustable base structure may be moved the distance along the plane in a first direction (e.g., the first direction 305) so that the distance in which the contact pad is spaced from the semiconductor wafer is within the predefined range. In some embodiments in which the distance in which the contact pad is spaced from the semiconductor wafer is outside the predefined range, the adjustable base structure may be moved the distance along the plane in a second direction (e.g., the second direction 307) so that the distance in which the contact pad is spaced from the semiconductor wafer is within the predefined range. In some embodiments, act 1508 comprises act 1414 (see, e.g., FIG. 14). In further embodiments, act 1506 and act 1508 are collectively referred to as act 1510.

At act 1512, act 1510 is repeated a predefined number of times (e.g., 1 time, 2 times, 4 time, 10 times, 100 times, etc.) during the fabrication process. In some embodiments, act 1512 and act 1510 are collectively referred to as act 1514. In some embodiments, act 1514 may be referred to as a feedback loop.

By repeating act 1510 the predefined number of times during the fabrication process, the spacing between the distance in which the contact pad is spaced from the semiconductor wafer may stay within the predefined range throughout the entire fabrication process. For example, in some embodiments, the fabrication process may cause the semiconductor wafer to warp during the fabrication process (e.g., during the deposition process). A typical wafer chuck (e.g., non-adjustable wafer chuck) may not be able to adjust to the warping of the semiconductor wafer, which may lead to premature wear of a contact pad of the typical wafer chuck. Because act 1510 is repeated the predefined number of times during the fabrication process, the adjustable wafer chuck may be able to ensure the distance in which the contact pad is spaced from the semiconductor wafer stays within the predefined range throughout the entire fabrication process, which may cause the contact pad of the adjustable wafer chuck to be less prone to premature wear. Thus, in comparison to a typical wafer chuck, the adjustable wafer chuck may decrease a cost to fabricate ICs (e.g., improve productivity, decrease maintenance costs, etc.).

At act 1516, the fabrication process is ended. In some embodiments, ending the fabrication process comprises removing the semiconductor wafer from the adjustable wafer chuck (e.g., dechucking the semiconductor wafer). In further embodiments, ending the fabrication process comprises removing the semiconductor wafer from the processing chamber. It will be appreciated that ending the fabrication process may comprise other suitable actions (e.g., stopping active deposition of a material onto the semiconductor wafer). While the flowchart 1500 of FIG. 15 only describes adjusting one adjustable base structure of an adjustable wafer chuck, it will be appreciate that the adjustable wafer cuck may comprise a plurality of base structure that may be independently adjusted in a substantially similar manner as described above.

Figure 16:
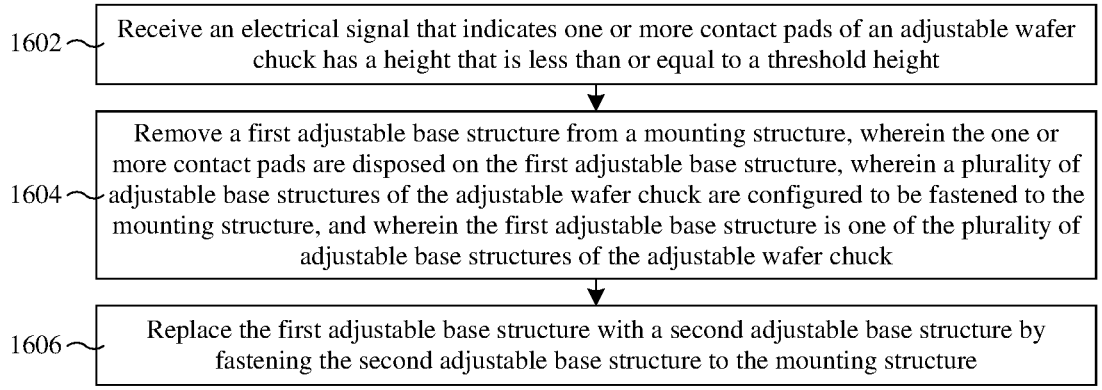
FIG. 16 illustrates a flowchart of some other embodiments of a method for operating a system comprising the adjustable wafer chuck.

FIG. 16 illustrates a flowchart 1600 of some other embodiments of a method for operating a system comprising the adjustable wafer chuck. While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1602 an electrical signal is received that indicates one or more contact pads (e.g., one or more of the plurality of contact pads 126) of an adjustable wafer chuck (e.g., the adjustable wafer chuck 116) has a height that is less than or equal to a threshold height. In some embodiments, the electrical signal is received by a controller (e.g., the controller 708). In some embodiments, the electrical signal is provided to the controller via a sensor (e.g., one of the plurality of sensors 704). In some embodiments, the electrical signal may correspond to an electrical resistance between a chucking electrode (e.g., the second chucking electrode 710*b*) and a power supply (e.g., the second power supply 706*b*) that is electrically coupled to the chucking electrode is determined. In some embodiments, the electrical resistance between the chucking electrode and the power supply is determined when the adjustable wafer chuck is "ON" (e.g., when the power supply is applying power to the chucking electrode to electrostatically clamp the wafer to the adjustable wafer chuck).

In some embodiments, the electrical signal may indicate that the height(s) of the one or more contact pads of the adjustable wafer chuck is less than or equal to the threshold height when the electrical signal is outside a predefined range of electrical signals. In further embodiments, in response to receiving the electrical signal, the controller may automatically initiate a warning signal. In further embodiments, the warning signal may be, for example, a text box or graphical icon that is displayed on a display device (e.g., monitor, LED display, etc.), an audible tone that is emitted from an audio signaling device (e.g., buzzer, speaker, etc.), some other suitable waring signal, or a combination of the foregoing.

At act 1604, a first adjustable base structure (e.g., the second adjustable base structure 124*b*) is removed from a mounting structure (e.g., the support structure 1202, the chuck pedestal 117, etc.). The one or more contact pads are disposed on the first adjustable base structure. A plurality of adjustable base structures (e.g., the plurality of adjustable base structures 124) of the adjustable wafer chuck are configured to be fastened (e.g., via the plurality of fastening structures 1104) to the mounting structure, and the first adjustable base structure is one of the plurality of adjustable base structures of the adjustable wafer chuck. In some embodiments, the first adjustable base structure may be removed by a user (e.g., a technician) in response to receiving (e.g., becoming aware of) the warning signal. In other embodiments, the first adjustable base structure may be removed automatically (e.g., via a robotic system) in response to the controller receiving the electrical signal.

At act 1606, the first adjustable base structure is replaced with a second adjustable base structure (e.g., a new adjustable base structure that is substantially the same as a new (e.g., non-worn) version of the second adjustable base structure 124*b*) by fastening the second adjustable base structure to the mounting structure. In some embodiments, the user may replace the first adjustable base structure with the second adjustable base structure. In other embodiments, the first adjustable base structure may be replaced with the second adjustable base structure automatically (e.g., via the robotic system). In further embodiments, replacing the first adjustable base structure with the second adjustable base structure may comprise aligning one or more alignment structures (e.g., first plurality of alignment indicators 1102, second plurality of alignment indicators 1206, etc.).

Because the first adjustable base structure may be replaced with the second adjustable base structure once one or more contact pads of the first adjustable base structure are below the threshold height, the adjustable wafer chuck may be easier to repair than a typical wafer chuck. For example, once one or more contact pads of a typical wafer chuck has a height below a threshold height, the entire wafer chuck may have to be removed from its processing chamber and sent to a specialized processing facility to repair the typical wafer chuck. On the other hand, once the one or more contact pads has a height below the threshold height, their corresponding adjustable base structure may be removed and replaced (rather than the entire adjustable wafer chuck). Accordingly, the adjustable wafer chuck may decrease a cost to fabricate ICs (e.g., by reducing downtime, reducing repair cost, reducing material waste, etc.).

While the flowchart 1600 of FIG. 16 only describes replacing one adjustable base structure of a plurality of adjustable base structures, it will be appreciate that the any number of the plurality of adjustable base structures may be replaced in a substantially similar manner as described above.

In some embodiments, the present application provides an apparatus. The apparatus comprises a wafer chuck configured to hold a wafer. The wafer chuck comprises a base portion and a pad portion. The pad portion is disposed on a first side of the base portion. The base portion comprises a plurality of adjustable base structures. The pad portion comprises a plurality of contact pads affixed to the plurality of adjustable base structures. Each of the contact pads has a corresponding one of the adjustable base structures. Each of the contact pads is affixed to its corresponding one of the adjustable base structures. Each of the adjustable base structures are configured to move along a plane in a first direction and configured to move along the plane in a second direction that is opposite the first direction.

In some embodiments, the present application provides an apparatus. The apparatus comprises a wafer chuck configured to hold a wafer. The wafer chuck comprises a base portion and a pad portion. The pad portion is disposed on a first side of the base portion. The base portion comprises a first adjustable base structure and a second adjustable base structure. Both the first adjustable base structure and the second adjustable base structure are ring shaped. The first adjustable base structure and the second adjustable base structure are concentric about a center point. The first adjustable base structure laterally surrounds the second adjustable base structure. The pad portion comprises a first plurality of contact pads affixed to the first adjustable base structure and a second plurality of contact pads affixed to the second adjustable base structure. A first actuator is coupled to the first adjustable base structure, wherein the first actuator is configured to move the first adjustable base structure along a plane in a first direction and along the plane in a second direction that is opposite the first direction. A second actuator is coupled to the second adjustable base structure, wherein the second actuator is configured to move the second adjustable base structure along the plane in the first direction and along the plane in the second direction.

In some embodiments, the present application provides a method. The method comprises placing a semiconductor wafer onto a wafer chuck, wherein the wafer chuck comprises an adjustable base structure, a plurality of contact pads, and a chucking electrode, wherein the plurality of contact pads are affixed to a surface of the adjustable base structure, wherein the chucking electrode is disposed in the adjustable base structure, and wherein the semiconductor wafer is placed into the wafer chuck so that the plurality of contact pads are disposed between the semiconductor wafer and the adjustable base structure. An electrical resistance between the chucking electrode and a power supply that is electrically coupled to the chucking electrode is determined, wherein the electrical resistance is determined via a sensor. A first electrical signal is provided to a controller, wherein the first electrical signal is provided to the controller via the sensor, and wherein the first electrical signal corresponds to the electrical resistance. The first electrical signal is analyzed to determine if the electrical resistance is within a predefined range, wherein the controller analyzes the first electrical signal. If the controller determines that the electrical resistance is outside the predefined range, a second electrical signal is provided to an actuator, wherein the second electrical signal is provided to the actuator via the controller, wherein the actuator is coupled to the adjustable base structure, wherein the second electrical signal causes the actuator to move a movable structure of the actuator a first predefined distance thereby causing the adjustable base structure to move a second predefined distance along a plane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
a base portion of a wafer chuck comprising a plurality of adjustable base structures, the wafer chuck configured to hold a wafer; and
a pad portion of the wafer chuck disposed on a first side of the base portion and comprising a plurality of contact pads disposed on the plurality of adjustable base structures,
wherein the contact pads have a top surface directly contacting the wafer; and
wherein each of the adjustable base structures is configured to move along a plane in a first direction and configured to move along the plane in a second direction that is opposite the first direction.

2. The apparatus of claim 1, wherein each of the adjustable base structures is configured to move independently along the plane.

3. The apparatus of claim 1, wherein each of the adjustable base structures have a ring-like shape.

4. The apparatus of claim 3, wherein the plurality of adjustable base structures is laterally spaced from one another.

5. The apparatus of claim 3, wherein the plurality of adjustable base structures are concentric.

6. The apparatus of claim 1, wherein each of the plurality of adjustable base structures have a thickness between about 25 millimeters (mm) and about 35 mm.

7. The apparatus of claim 1, wherein each of the contact pads have a height between about 0.5 millimeters (mm) and about 5 mm.

8. The apparatus of claim 1, further comprising:
a plurality of actuators coupled to the plurality of adjustable base structures, respectively, wherein the plurality of actuators are configured to respectively move the plurality of adjustable base structures along the plane.

9. The apparatus of claim 1, wherein the adjustable base structures are configured to move along the plane so that each of the plurality of contact pads are spaced about a same distance from the wafer during a fabrication step.

10. The apparatus of claim 9, further comprising:
a plurality of actuators coupled to the plurality of adjustable base structures, respectively, wherein the plurality of actuators are configured to respectively move the plurality of adjustable base structures along the plane;
a plurality of chucking electrodes disposed in the plurality of adjustable base structures, respectively; and
a plurality of sensors that are configured to determine distances in which the plurality of chucking electrodes are spaced from a surface of the wafer, wherein the plurality of sensors are configured to generate a plurality of electrical signals that correspond to the distances in which the plurality of chucking electrodes are spaced from the surface of the wafer, and wherein the plurality of actuators are configured to move the plurality of adjustable base structures based on the electrical signals.

11. The apparatus of claim 10, further comprising:
a power supply electrically coupled to the plurality of chucking electrodes, wherein the plurality of sensors determine the distances in which the plurality of chucking electrodes are spaced from the surface of the wafer by measuring electrical resistances between the plurality of chucking electrodes and the power supply.

12. An apparatus, comprising:
a wafer chuck configured to hold a wafer, wherein:
the wafer chuck comprises a base portion and a pad portion;
the pad portion is disposed on a first side of the base portion;
the base portion comprises a first adjustable base structure and a second adjustable base structure;

both the first adjustable base structure and the second adjustable base structure are ring shaped;

the first adjustable base structure and the second adjustable base structure are concentric about a center point;

the first adjustable base structure laterally surrounds the second adjustable base structure; and the pad portion comprises a first plurality of contact pads affixed to the first adjustable base structure and a second plurality of contact pads affixed to the second adjustable base structure.

13. The apparatus of claim 12, further comprising:
a first chucking electrode disposed in the first adjustable base structure; and
a second chucking electrode disposed in the second adjustable base structure.

14. The apparatus of claim 13, further comprising:
a first electrical connector electrically coupled to the first chucking electrode, wherein the first electrical connector is configured to provide an electrical connection between the first chucking electrode and a first power supply; and
a second electrical connector electrically coupled to the second chucking electrode, wherein the second electrical connector is configured to provide an electrical connection between the second chucking electrode and a second power supply.

15. The apparatus of claim 14, further comprising:
a first sensor configured to determine a distance in which the first plurality of contact pads are spaced from a surface of the wafer, wherein the first sensor is configured to generate a first electrical signal that corresponds to the distance in which the first plurality of contact pads are spaced from the surface of the wafer, and wherein a first actuator is configured to move the first adjustable base structure based on the first electrical signal; and
a second sensor configured to determine a distance in which the second plurality of contact pads are spaced from the surface of the wafer, wherein the second sensor is configured to generate a second electrical signal that corresponds to the distance in which the second plurality of contact pads are spaced from the surface of the wafer, and wherein a second actuator is configured to move the second adjustable base structure based on the second electrical signal.

16. The apparatus of claim 15, further comprising:
a controller electrically coupled to the first sensor, the second sensor, the first actuator, and the second actuator, wherein:
the controller is configured to receive the first electrical signal from the first sensor and provide a third electrical signal to the first actuator that corresponds to the first electrical signal;
in response to receiving the third electrical signal, the first actuator is configured to move the first adjustable base structure along a plane, thereby changing the distance in which the first plurality of contact pads are spaced from the surface of the wafer;

the controller is configured to receive the second electrical signal from the second sensor and provide a fourth electrical signal to the second actuator that corresponds to the second electrical signal; and in response to receiving the fourth electrical signal, the second actuator is configured to move the second adjustable base structure along the plane, thereby changing the distance in which the second plurality of contact pads are spaced from the surface of the wafer.

17. The apparatus of claim 16, wherein:
the first sensor determines the distance in which the first plurality of contact pads are spaced from the surface of the wafer by measuring an electrical resistance between the first chucking electrode and the first power supply; and
the second sensor determines the distance in which the second plurality of contact pads are spaced from the surface of the wafer by measuring an electrical resistance between the second chucking electrode and the second power supply.

18. The apparatus of claim 12, wherein:
the first adjustable base structure is laterally spaced from the second adjustable base structure by a gap;
the gap extends laterally around the second adjustable base structure in a closed loop path; and
the first adjustable base structure and the second adjustable base structure are configured to move independently of one another.

19. A method, the method comprising:
placing a semiconductor wafer onto a wafer chuck, wherein the wafer chuck comprises an adjustable base structure, a plurality of contact pads, and a chucking electrode, wherein the plurality of contact pads are affixed to a surface of the adjustable base structure, wherein the chucking electrode is disposed in the adjustable base structure, and wherein the semiconductor wafer is placed into the wafer chuck on the plurality of contact pads;

determining an electrical resistance between the chucking electrode and a power supply, wherein the electrical resistance is determined via a sensor;

providing a first electrical signal to a controller, wherein the first electrical signal is provided to the controller via the sensor;
and
if the controller determines that the electrical resistance is outside a predefined range, providing a second electrical signal to an actuator, wherein the second electrical signal is provided to the actuator via the controller, wherein the second electrical signal causes the actuator to move a movable structure.

20. The method of claim 19, wherein the actuator moves the adjustable base structure a predefined distance that is equal to a distance along a plane in which the plurality of contact pads were spaced from the semiconductor wafer before the second electrical signal was provided to the actuator.

* * * * *